(12) United States Patent
Forrest et al.

(10) Patent No.: US 10,243,018 B2
(45) Date of Patent: Mar. 26, 2019

(54) NON-PLANAR INORGANIC OPTOELECTRONIC DEVICES

(71) Applicants: Stephen Forrest, Ann Arbor, MI (US); Jeramy D. Zimmerman, Ann Arbor, MI (US); Xin Xu, West Windsor, NJ (US); Christopher Kyle Renshaw, Ann Arbor, MI (US)

(72) Inventors: Stephen Forrest, Ann Arbor, MI (US); Jeramy D. Zimmerman, Ann Arbor, MI (US); Xin Xu, West Windsor, NJ (US); Christopher Kyle Renshaw, Ann Arbor, MI (US)

(73) Assignees: The Regents of the University of Michigan, Ann Arbor, MI (US); Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/720,312

(22) Filed: May 22, 2015

(65) Prior Publication Data
US 2015/0357366 A1    Dec. 10, 2015

Related U.S. Application Data

(62) Division of application No. 13/536,003, filed on Jun. 28, 2012, now Pat. No. 9,065,010.
(Continued)

(51) Int. Cl.
*H01L 31/00* (2006.01)
*H01L 27/146* (2006.01)
(Continued)

(52) U.S. Cl.
CPC .... *H01L 27/14643* (2013.01); *H01L 27/1446* (2013.01); *H01L 27/14618* (2013.01);
(Continued)

(58) Field of Classification Search
CPC .......... H01L 27/1446; H01L 27/14643; H01L 27/14636; H01L 31/03926; H01L 31/075; H01L 31/1844; H01L 31/1892
See application file for complete search history.

(56) References Cited

U.S. PATENT DOCUMENTS 4,366,186 A * 12/1982 Keramidas ............ H01L 29/452
    136/256
6,552,414 B1    4/2003 Horzel et al.
(Continued)

OTHER PUBLICATIONS

Heung Cho Ko et al., "A Hemispherical Electronic Eye Camera Based on Compressible Silicon Optoelectronics", Nature, Aug. 7, 2008, pp. 748-753, vol. 454.
(Continued)

*Primary Examiner* — Mounir S Amer
*Assistant Examiner* — Alexander Belousov
(74) *Attorney, Agent, or Firm* — Lempia Summerfield Katz LLC

(57) ABSTRACT

A device includes a three-dimensionally curved substrate, a patterned metal layer disposed on the curved substrate, and an array of optoelectronic devices, each optoelectronic device including an optoelectronic structure supported by the curved substrate. Each optoelectronic structure includes an inorganic semiconductor stack. The device further includes a set of contact stripes extending across the curved substrate, each optoelectronic structure being coupled to a respective contact stripe of the set of contact stripes. The array of optoelectronic devices is secured to the curved substrate via a bond between the patterned metal layer and the set of contact stripes.

19 Claims, 29 Drawing Sheets

Related U.S. Application Data

(60) Provisional application No. 61/502,226, filed on Jun. 28, 2011.

(51) Int. Cl.
  *H01L 31/0304* (2006.01)
  *H01L 31/0224* (2006.01)
  *H01L 27/144* (2006.01)
  *H01L 31/0392* (2006.01)
  *H01L 31/075* (2012.01)
  *H01L 31/18* (2006.01)

(52) U.S. Cl.
  CPC .......... *H01L 27/14636* (2013.01); *H01L 31/022408* (2013.01); *H01L 31/0304* (2013.01); *H01L 31/03926* (2013.01); *H01L 31/075* (2013.01); *H01L 31/1844* (2013.01); *H01L 31/1892* (2013.01); *Y02E 10/544* (2013.01); *Y02E 10/548* (2013.01)

(56) References Cited

U.S. PATENT DOCUMENTS

| | | | |
|---|---|---|---|
| 2002/0148113 A1 | 10/2002 | Forrest et al. | |
| 2004/0121568 A1* | 6/2004 | Kim | H01L 51/0004 438/584 |
| 2007/0139299 A1 | 6/2007 | Huang et al. | |
| 2007/0266949 A1* | 11/2007 | Shenai-Khatkhate | C23C 16/4481 118/726 |
| 2008/0202673 A1 | 8/2008 | Forrest et al. | |
| 2009/0020910 A1 | 1/2009 | Forrest et al. | |
| 2010/0047959 A1* | 2/2010 | Cornfeld | H01L 31/06875 438/94 |
| 2010/0080914 A1* | 4/2010 | Forrest | H01L 51/0021 427/259 |
| 2011/0139238 A1 | 6/2011 | Hang et al. | |

OTHER PUBLICATIONS

Jongseung Yoon et al., "GaAs Photovoltaics and Optoelectronics Using Releasable Multilayer Epitaxial Assemblies", Letters, Nature, May 20, 2010, pp. 329-334, vol. 465.

Kuen-Ting Shiu, "Ultrathin Film, High Specific Power InP Solar Cells on Flexible Plastic Substrates", Applied Physics Letters 95, 2009, 3 pages, American Institute of Physics.

R. Philbrick et al., "95 Million Pixel Focal Plane for Use on the Kepler Discovery Mission", Scientific Detectors for Astronomy, Astrophysics and Space Science Library, 2004, pp. 581-590, vol. 300.

Sang-Il Park et al., "Printed Assemblies of Inorganic Light-Emitting Diodes for Deformable and Semitransparent Displays", Science, Aug. 21, 2009, 51 pages, vol. 325.

Xin Xu et al., "Direct Transfer Patterning on Three Dimensionally Deformed Surfaces at Micrometer Resolutions and its Application to Hemispherical Focal Plane Detector Arrays", Organic Electronics, 2008, pp. 1122-1127, vol. 9, Elsevier.

\* cited by examiner

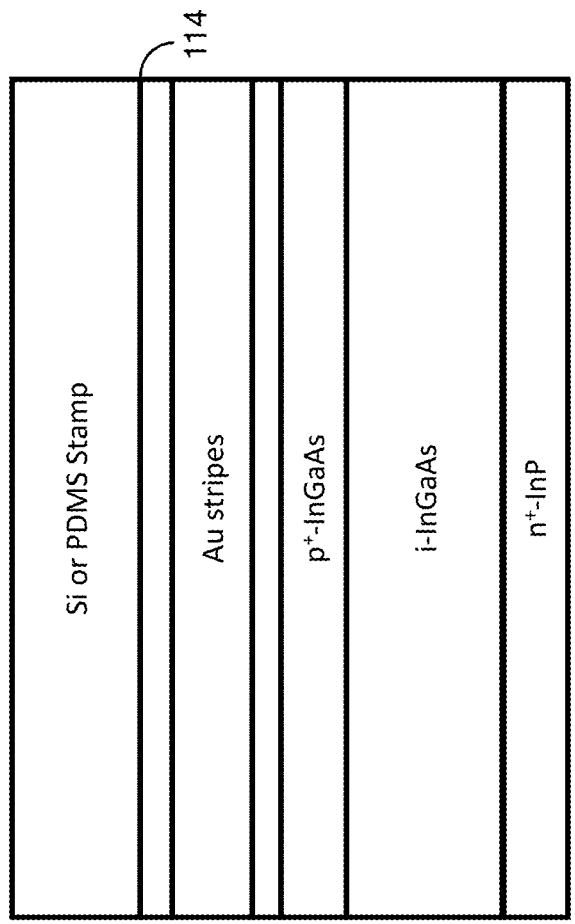
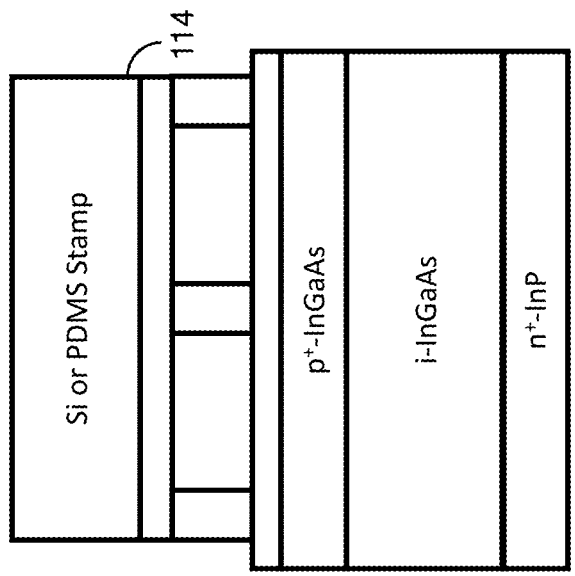
FIG. 4B
FIG. 4A

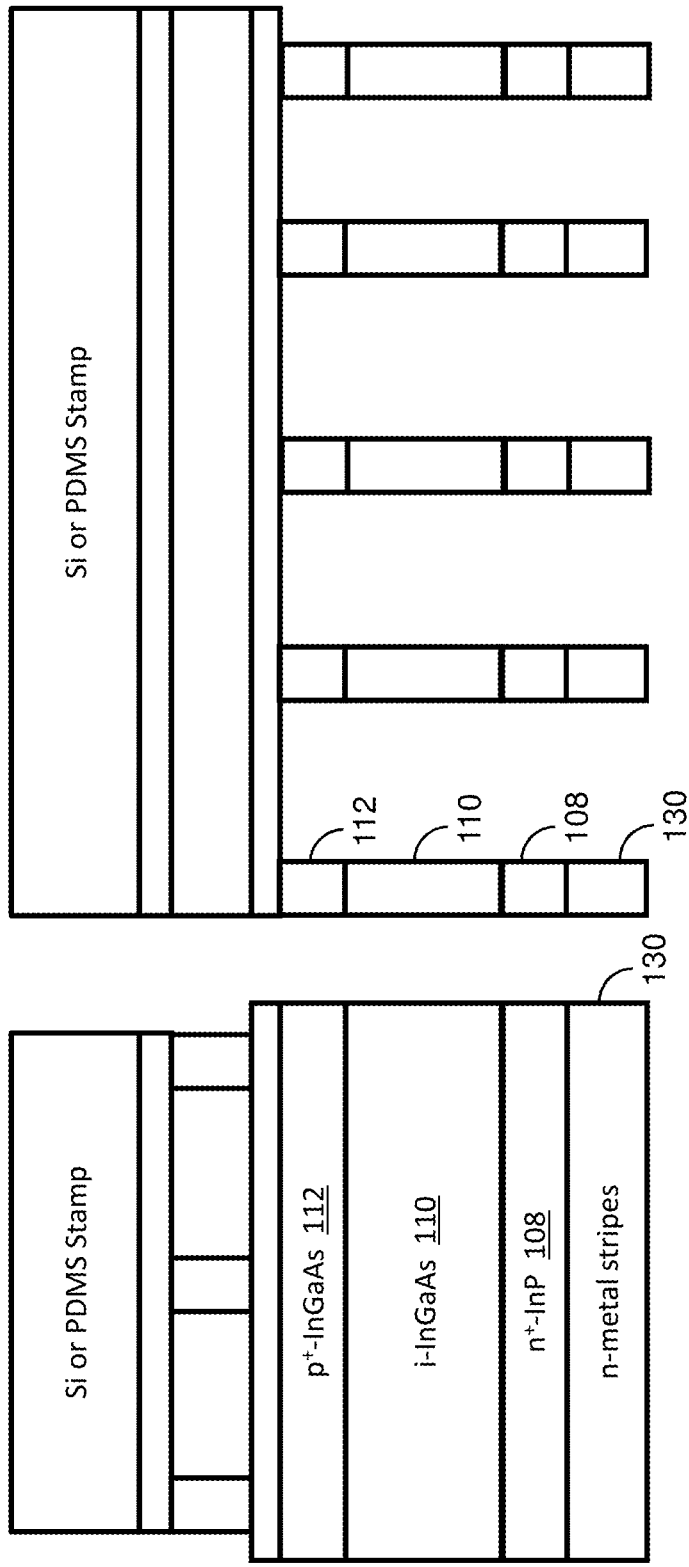

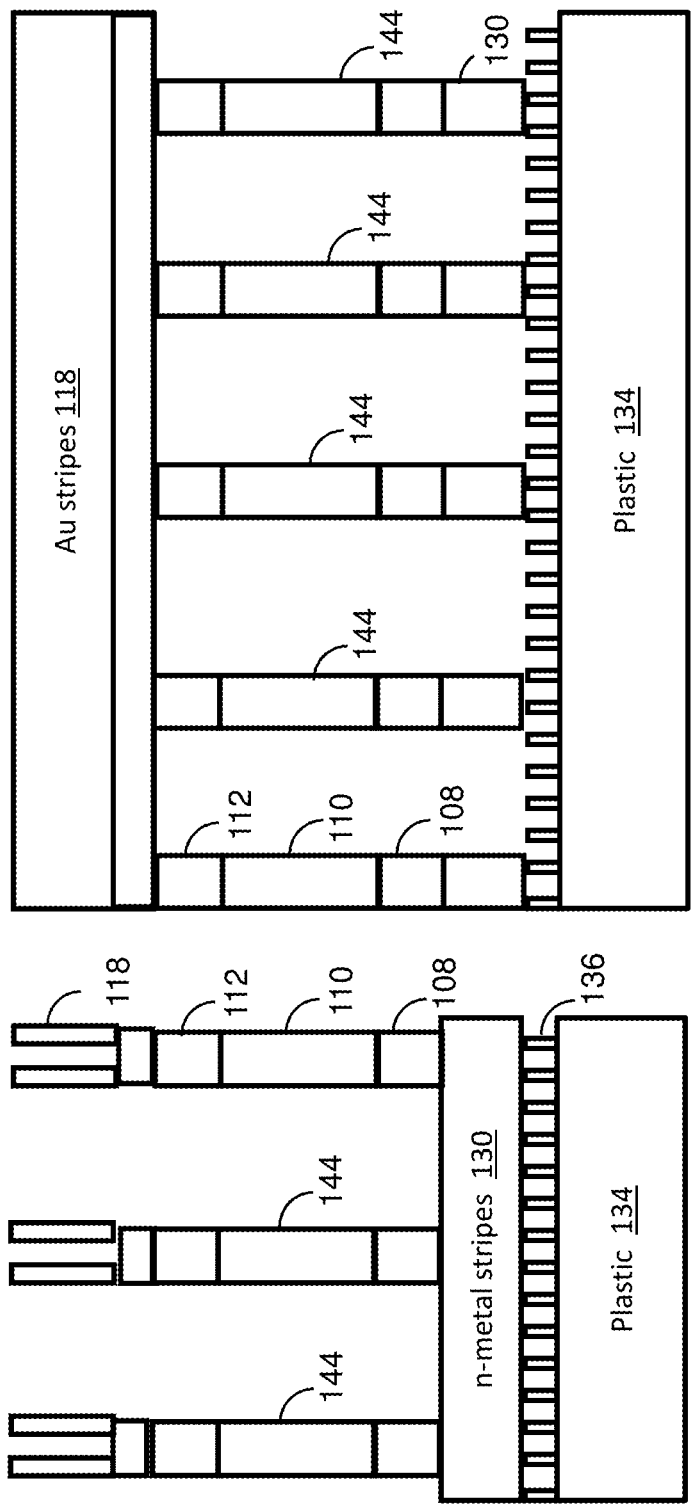

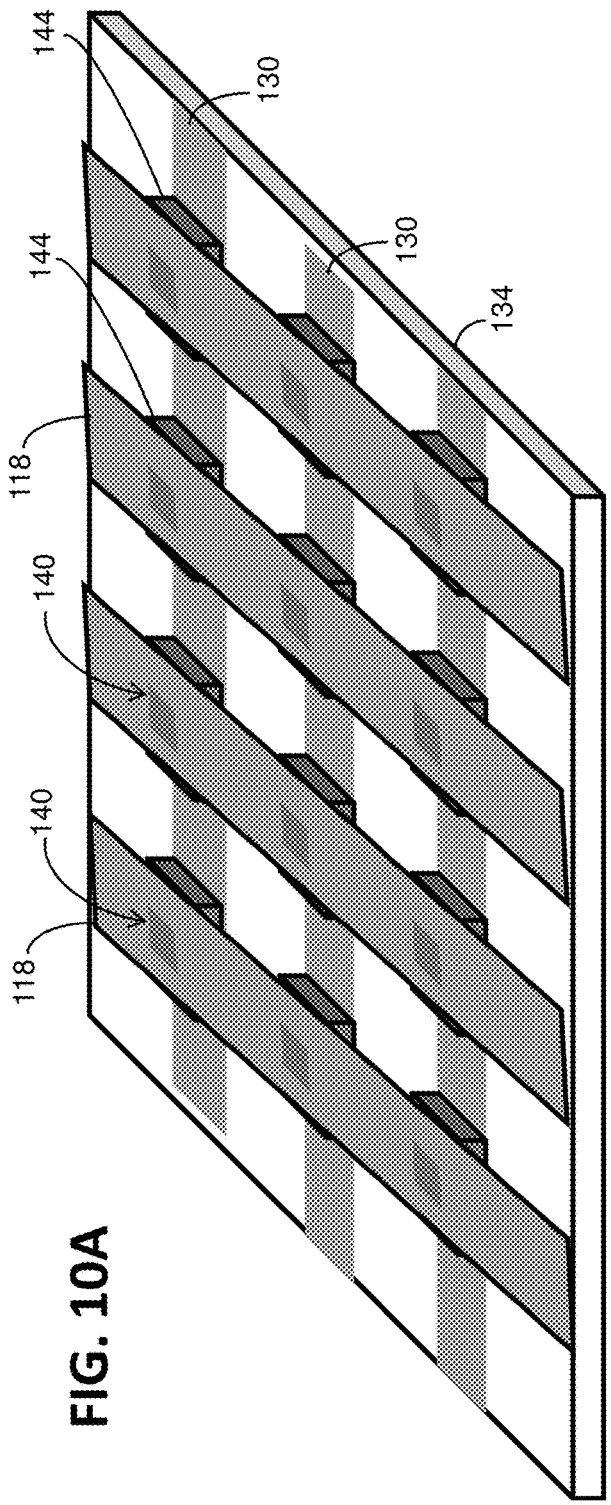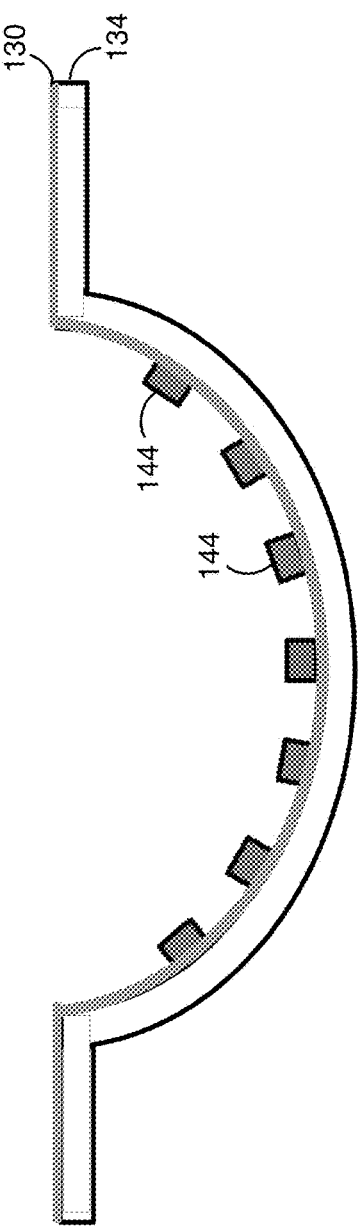
FIG. 10A
FIG. 10B

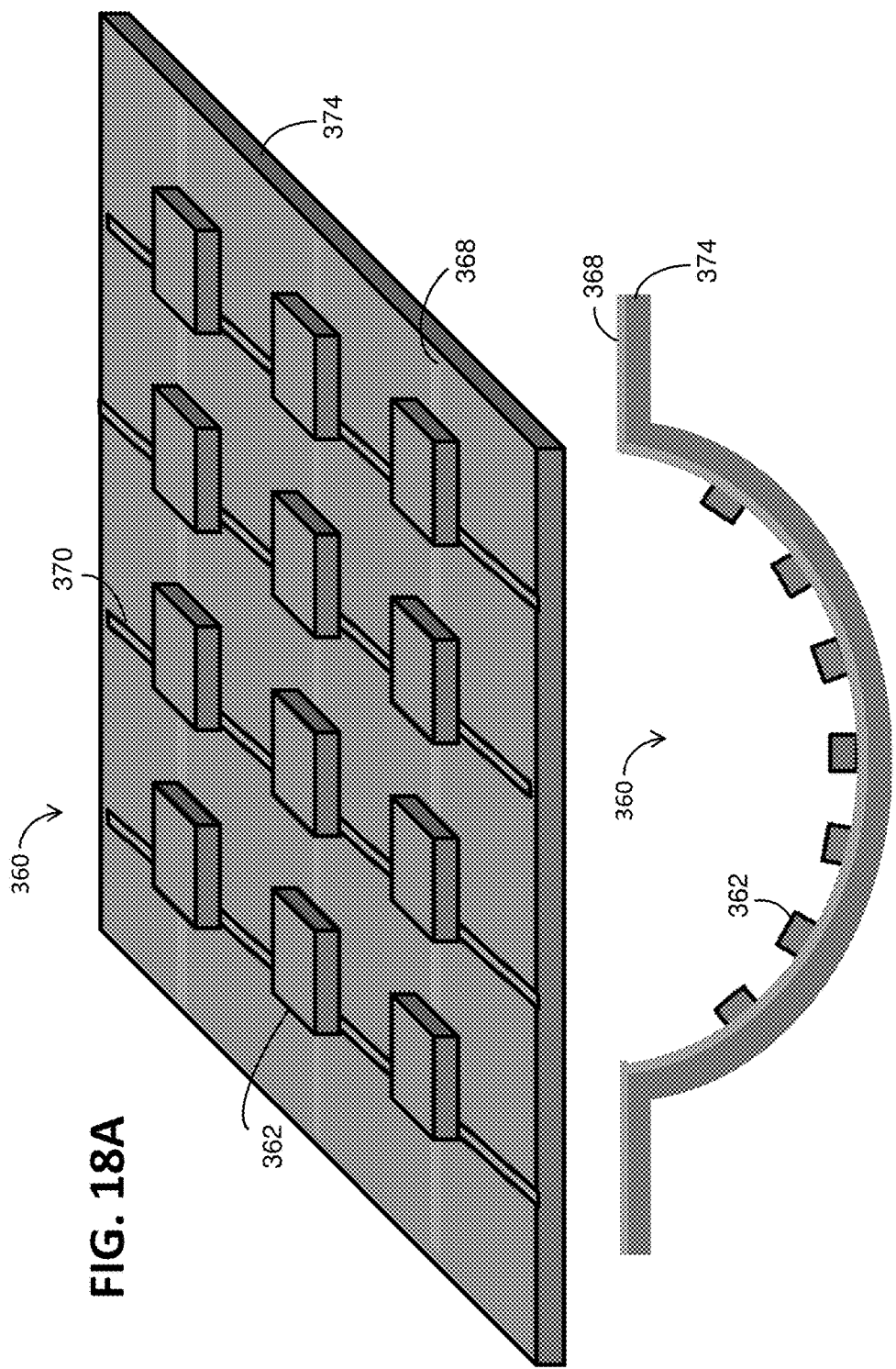

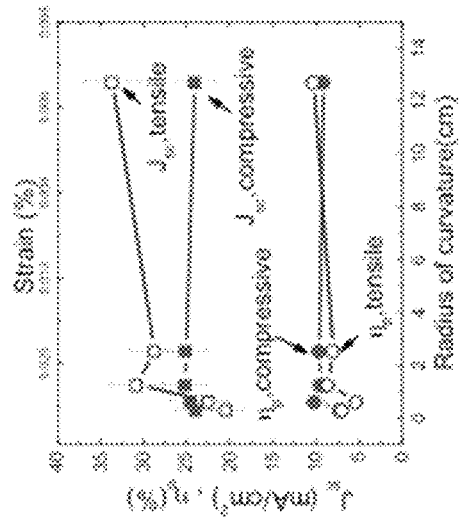
FIG. 25B
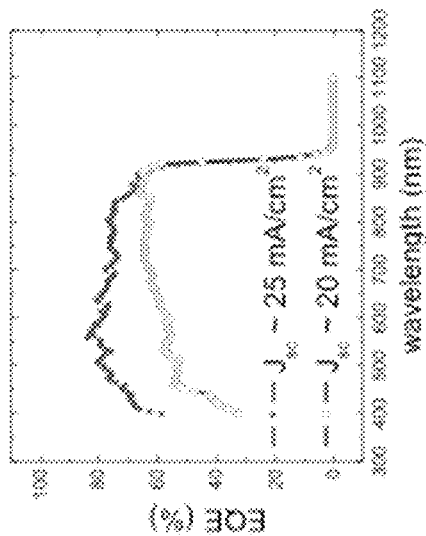
FIG. 25C
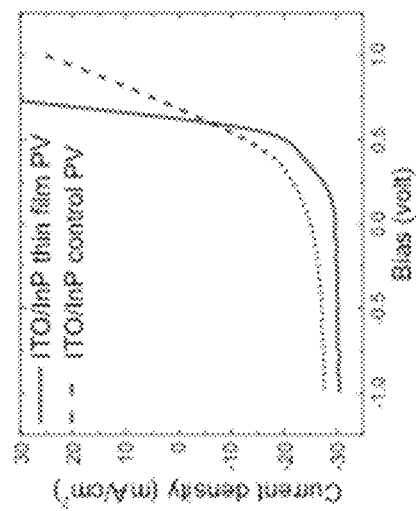
FIG. 25A
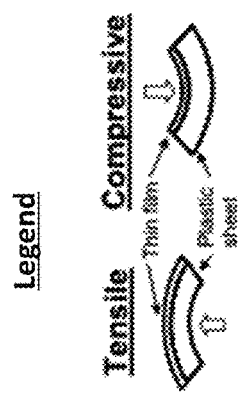
Legend

NON-PLANAR INORGANIC OPTOELECTRONIC DEVICES

CROSS-REFERENCES TO RELATED APPLICATIONS

This application is a divisional of the U.S. non-provisional application entitled "Non-Planar Inorganic Optoelectronic Devices," filed Jun. 28, 2012, and assigned Ser. No. 13/536,003, which, in turn, claimed the benefit of U.S. provisional application entitled "Non-Planar Inorganic Optoelectronic Devices," filed Jun. 28, 2011, and assigned Ser. No. 61/502,226, the entire disclosures of which are hereby expressly incorporated by reference.

STATEMENT REGARDING FEDERALLY SPONSORED RESEARCH OR DEVELOPMENT

This invention was made with government support under Contract No. W15P7T-08-C-P409 awarded by the Defense Advanced Research Projects Agency (DARPA) of the Department of Defense (Army). The government has certain rights in the invention.

JOINT RESEARCH AGREEMENT

The claimed invention was made by, on behalf of, or in connection with one or more of the following parties to a joint university-corporation research agreement: the Regents of the University of Michigan, Princeton University, the University of Southern California, and Universal Display Corporation. The agreement was in effect on and before the date the claimed invention was made, and the claimed invention was made as a result of activities undertaken within the scope of the agreement.

BACKGROUND OF THE DISCLOSURE

Field of the Disclosure

The disclosure relates to optoelectronic devices.

Brief Description of Related Technology

Current imaging systems require heavy and expensive compound lenses to project an object onto a flat focal plane array. Modern camera systems employ multiple, high f/number lens elements to create a distortion-free image on a flat focal or film plane.

In contrast, biological systems employ a hemispherical image plane, thereby simplifying the imaging optics. The approximately spherical human eye provides a nearly ideal imaging system. It is both compact and simple, with a wide field of view free of image distortion and a low f/number.

Creating an imaging system that mimics the form and function of the eye involves fabricating a focal plane onto a nearly spherical surface that matches the curvature of a single lens element. Fabrication of such focal planes presents the challenge of creating a high density of monolithically integrated photodetectors on a three-dimensionally curved surface.

One approach to fabricating photodetectors on curved surfaces uses an organic focal plane array (FPA) and a preformed plastic hemisphere. See Xu et al., "Direct transfer patterning on three-dimensionally deformed surfaces at micrometer resolutions and its application to hemispherical focal point detector arrays," Organic Electronics, vol. 9, pp. 1122-1127 (2008). The organic FPA in Xu includes organic double heterojunction photodetector structures having a copper phthalocyanine (CuPc) donor layer, a $C_{60}$ acceptor layer, and a bathocuproine (BCP) exciton blocking layer. These organic materials are well suited for deposition onto a hemispherical substrate, but unfortunately present other fabrication challenges and performance limitations.

SUMMARY OF THE DISCLOSURE

In accordance with one aspect of the disclosure, a method of fabricating an optoelectronic device includes creating an optoelectronic structure on a first substrate. The optoelectronic structure includes a release layer and a plurality of inorganic semiconductor layers supported by the release layer. The inorganic semiconductor layers are active in operation of the optoelectronic device. The method further includes attaching permanently the plurality of inorganic semiconductor layers to a second substrate, the second substrate being flexible, releasing the plurality of inorganic semiconductor layers from the first substrate after the attaching step, and deforming the second substrate to a non-planar configuration.

In accordance with another aspect of the disclosure, a method of fabricating an optoelectronic device includes creating an optoelectronic structure on a first substrate. The optoelectronic structure includes a release layer and a plurality of inorganic semiconductor layers supported by the release layer, the plurality of inorganic semiconductor layers being configured to be active in operation of the optoelectronic device. The method further includes depositing a first metal contact on the optoelectronic structure, depositing a second metal contact on a second substrate, the second substrate being flexible, attaching the first and second substrates via a cold weld bond between the first and second metal contacts, releasing the plurality of inorganic semiconductor layers from the first substrate, and deforming the second substrate to a non-planar configuration.

In accordance with yet another aspect of the disclosure, a device includes a three-dimensionally curved substrate, a patterned metal layer disposed on the three-dimensionally curved substrate, and an array of optoelectronic devices. Each optoelectronic device includes an optoelectronic structure supported by the three-dimensionally curved substrate. Each optoelectronic structure includes an inorganic semiconductor stack. The device further includes a set of contact stripes extending across the curved substrate, each optoelectronic structure being coupled to a respective contact stripe of the set of contact stripes. The array of optoelectronic devices is secured to the curved substrate via a bond between the patterned metal layer and the set of contact stripes.

BRIEF DESCRIPTION OF THE DRAWING FIGURES

FIGS. 4A and 4B depict respective schematic, sectional views of the epitaxial photodetector structure of FIG. 1 after a substrate has been removed via an etching step of the fabrication method of FIG. 1.

FIGS. 6A and 6B depict respective schematic, sectional views of the epitaxial photodetector structure and stamp assembly of FIG. 5 after an etch step of the fabrication method of FIG. 1 in which inorganic semiconductor detector layers of the structure are patterned.

FIGS. 9A and 9B depict respective schematic, sectional views of the flexible detector structure of FIG. 8 after the inorganic semiconductor detector layers are patterned into islands or mesas via an etching step of the fabrication method of FIG. 1.

FIG. 10A depicts a schematic, perspective view of an exemplary device fabricated as shown in FIGS. 1-9 to have a photodetector array on a flexible substrate.

FIG. 10B depicts a schematic, sectional view of the exemplary device of FIG. 10A after deformation of the device into a hemispherical or other three-dimensionally contoured shape.

FIG. 18A depicts a schematic, perspective view of an exemplary array of the exemplary active pixel devices of FIGS. 16 and 17 on a flexible substrate.

FIG. 18B depicts a schematic, sectional view of the exemplary device of FIG. 18A after deformation of the plastic substrate to deform the array into a hemispherical or other three-dimensionally contoured shape.

FIGS. 25A-25C are graphical plots of simulated solar illumination (1 sun, AM1.5G) of an exemplary ITO/InP thin film solar cell fabricated in accordance with one embodiment relative to a control solar cell, the graphical plots depicting (i) current density and voltage characteristics, (ii) external quantum efficiency (EQE) as a function of wavelength, and (iii) short circuit current (Jsc) and power conversion efficiency ($\eta_p$) of the thin film ITO/InP solar cell after either a compressive (bending inward) stress test or a tensile (bending outward) stress test.

Figure 26:
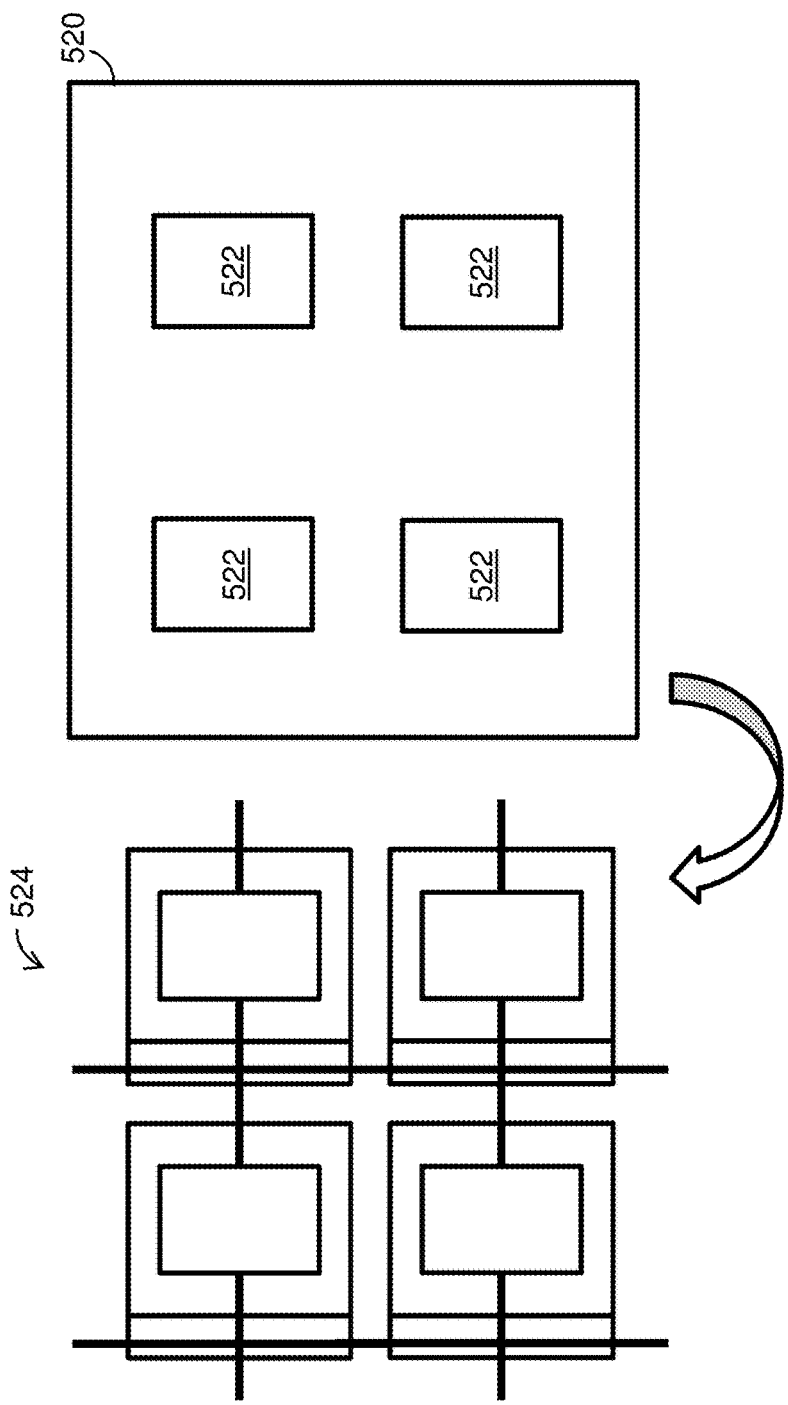
Figure 27:
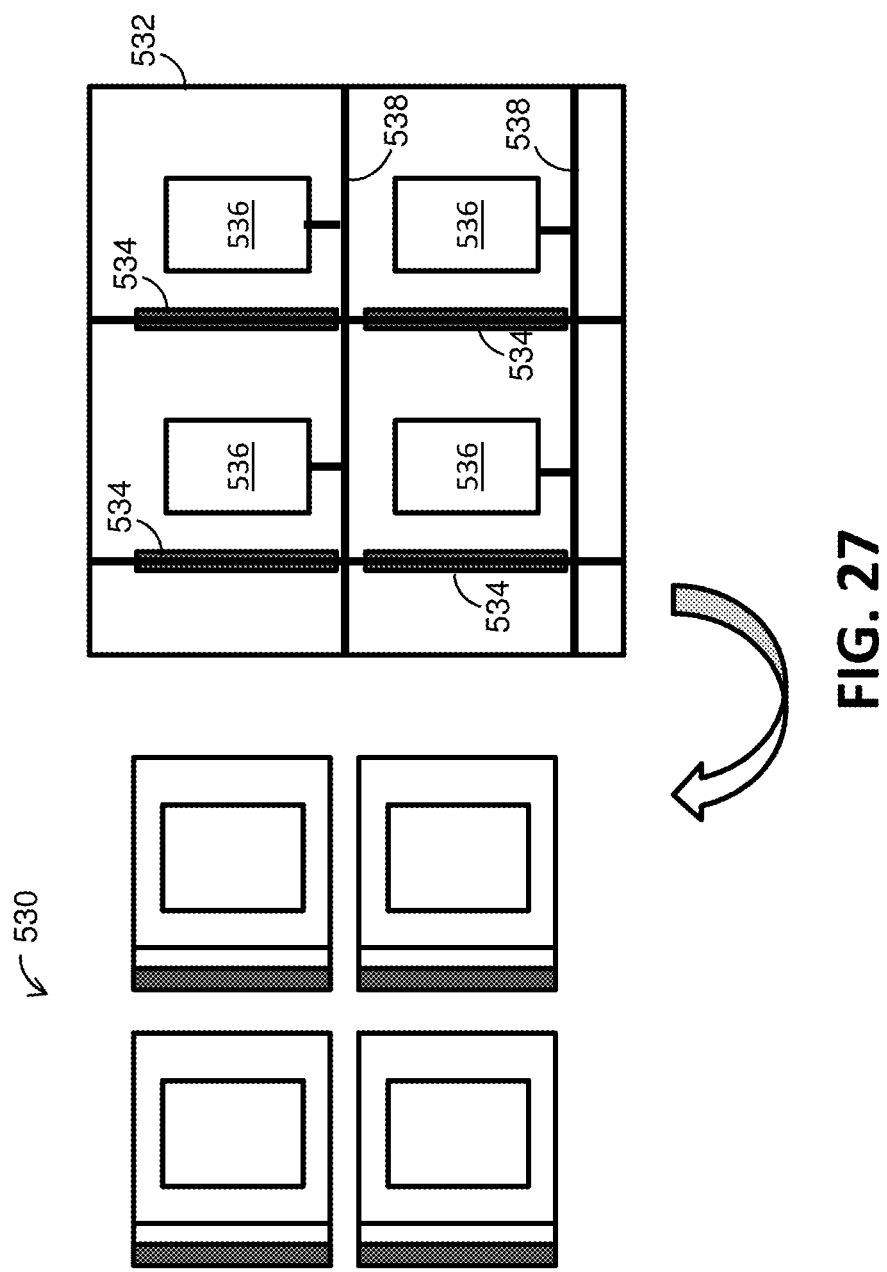
Figure 28:
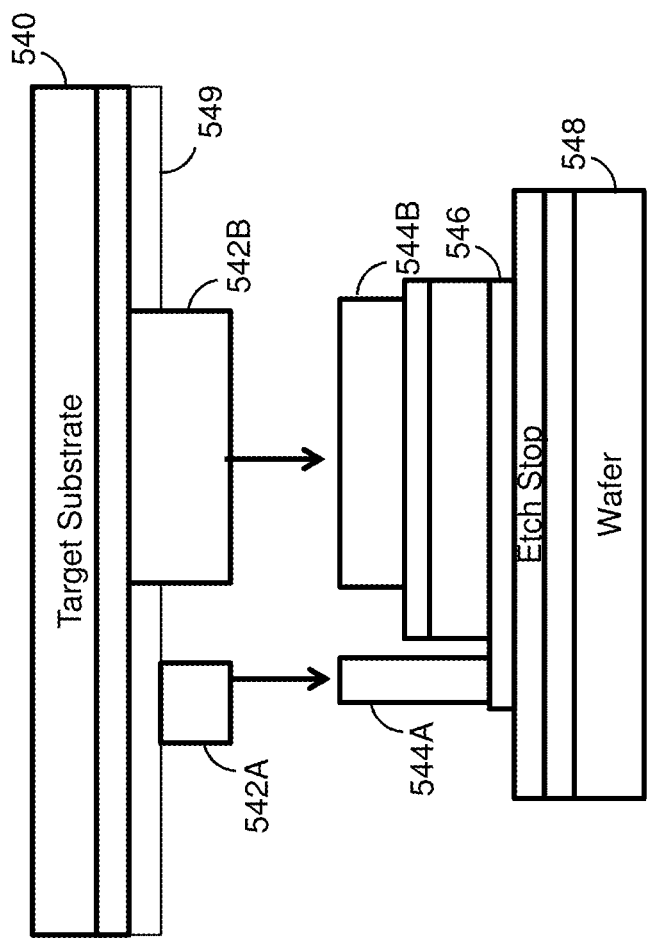

FIGS. 26-28 depict exemplary process flow steps, substrate layouts, and device structures in accordance with alternative embodiments.

Figure 29A:
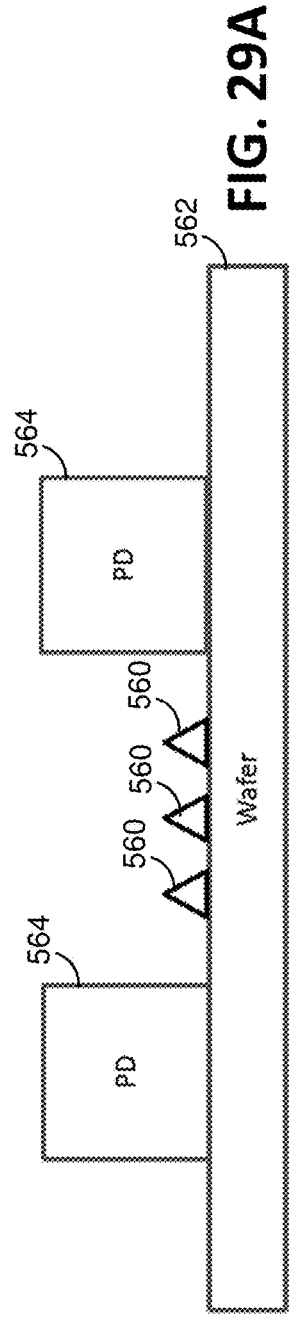
Figure 29B:
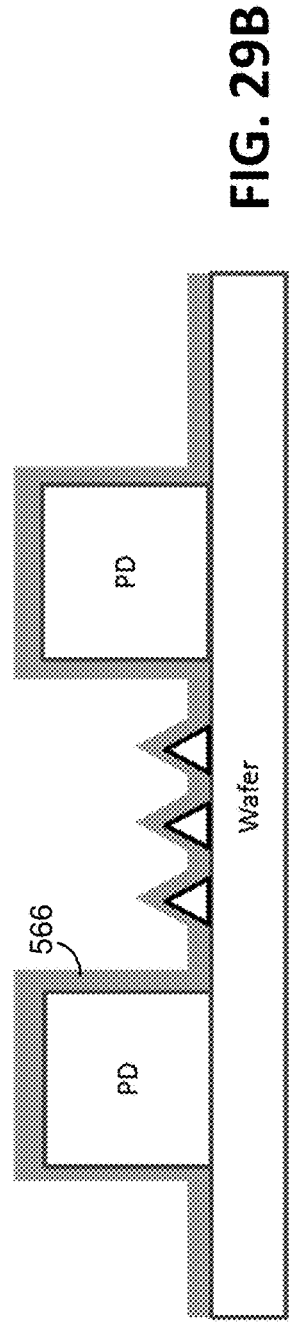
Figure 29C:
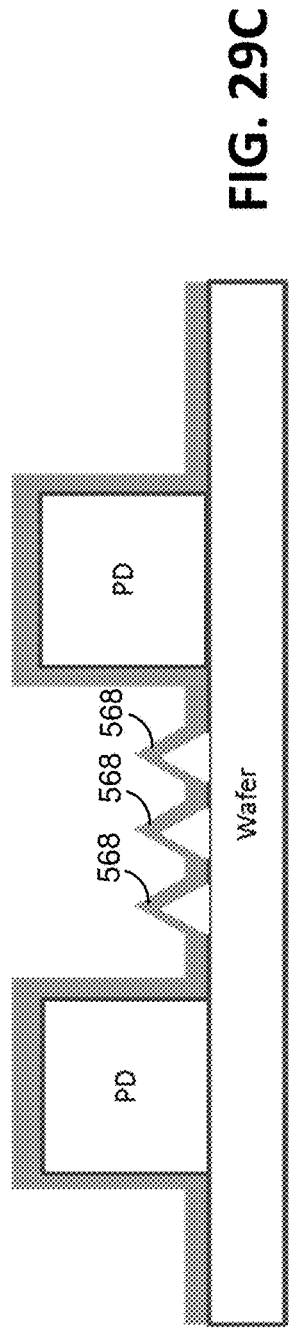

FIGS. 29A-29C depict schematic, sectional views of a technique for managing strain in bus lines in accordance with one embodiment.

Figure 30:
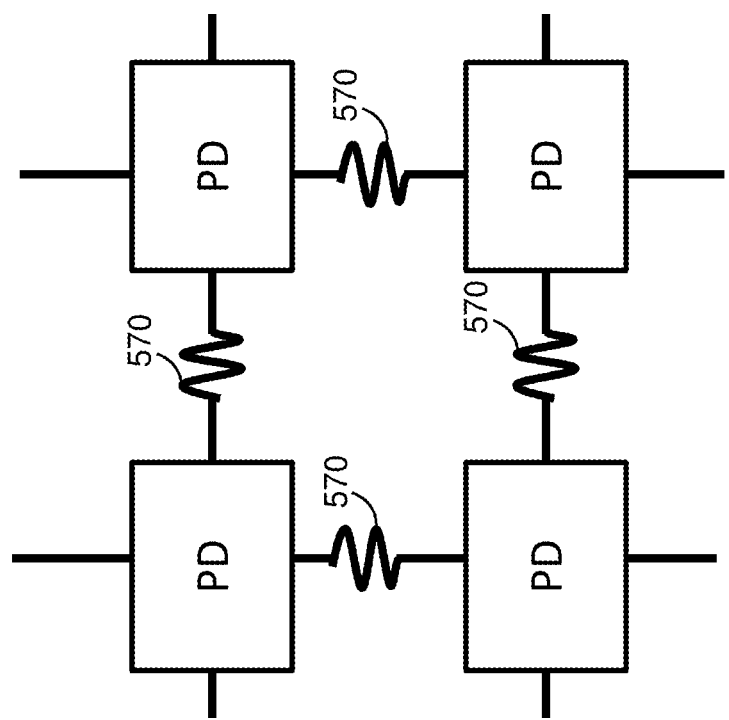

FIG. 30 depicts a schematic, plan view of another technique for managing strain in bus lines in accordance with one embodiment.

While the disclosed devices and methods are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE DISCLOSURE

Non-planar inorganic optoelectronic devices and processes for fabricating such devices on three-dimensionally contoured or deformed substrates are described. Photodetector arrays and other optoelectronic devices may be fabricated with inorganic semiconductor components and three-dimensionally contoured substrates. The disclosed devices and methods address the challenges of fabricating camera and other optoelectronic systems with an array of inorganic semiconductor photodetector on hemispherical or three-dimensionally curved substrates. The disclosed methods may thus be implemented to fabricate devices having a high density of high-performance semiconductor devices disposed on curved surfaces without breaks in detector layers or interconnects or other detrimental strains.

The disclosed fabrication methods generally include the creation of a photodetector structure on a wafer (or other substrate) by standard semiconductor processes. The photodetector structure includes inorganic semiconductor layers involved in the fabrication and operation of the desired devices. The inorganic semiconductor layers are disposed on top of, or are otherwise supported by, a release layer (e.g., an etch stop layer or a sacrificial etch layer used to release the devices from the wafer (or other substrate). The method may further include the steps of depositing a metal contact on the detector structure and on a flexible substrate, and attaching the two substrates together via a cold weld bond. Such permanent attachment of the two substrates may alternatively involve an adhesive attachment in which non-metal materials are used. The devices may be bonded to a final flexible (or deformable) substrate, or are bonded to an intermediate flexible (or deformable) stamp in order to subsequently bond the devices to a final flexible (or deformable) substrate. In either case, after the first bonding step, the devices are released from the wafer (or other substrate) to become flexible. The release may be achieved via mechanical, chemical, or other techniques.

The disclosed methods may be implemented to fabricate a hemispherical focal plane array (FPA) having one or more inorganic semiconductor layers, despite the challenge of processing such brittle materials along a hemispherical contour. Although described and shown in connection with hemispherical contours, the disclosed methods and devices are not limited to hemispherical shapes. Indeed, the disclosed methods are well suited for the fabrication of devices having a variety of three-dimensional shapes. With the flexibility of the disclosed optoelectronic devices, the disclosed devices may have any three-dimensional contour.

In accordance with some aspects of the disclosure, the disclosed methods incorporate one or more stamping procedures during the fabrication process flow. The stamping procedures may be used to transfer an electrode or interconnect from a stamp assembly to a photodetector structure and/or to transfer the photodetector structure from one substrate to another. In some cases, the transfer operation may be used to develop (e.g., metallize) both sides of the photodetector structure. The photodetector structures are also transferred in the disclosed methods via a stamping procedure to a flexible substrate to enable three-dimensional deformation or shaping. Further details regarding stamping procedures for use in transfer patterning of organic devices are set forth in Xu et al., "Direct transfer patterning on three-dimensionally deformed services at micrometer resolutions and its application to hemispherical focal point detector arrays," Organic Electronics, vol. 9, pp. 1122-1127 (2008), and U.S. Patent Publications Nos. 2008/0202673, 2009/0020910, 2010/0080914, the entire disclosures of which are hereby incorporated by reference.

Although described below in connection with photodetector-based devices (e.g., active pixels), arrays of such photodetector-based devices (e.g., active pixel arrays), and photodetector structures, multiple aspects of the disclosure are not limited to such devices, arrays, and structures. For example, the disclosed methods may be applied to the fabrication of other optoelectronic devices, such as light emitting diode (LED) devices, semiconductor laser devices, and circuits including various combinations of such devices and/or other electronic devices, such as transistor devices.

Although described below in connection with epitaxial structures, the disclosed optoelectronic devices may be fabricated with different substrate types. For example, the optoelectronic devices may include photodetector structures created with a silicon-on-insulator (SOI) substrate. In those cases, the buried silicon dioxide (SiO2) or other insulator layer may serve as a selective etch layer (e.g., an etch stop or sacrificial layer). The disclosed fabrication methods may then rely on implant and diffusion doping steps.

Figure 1:
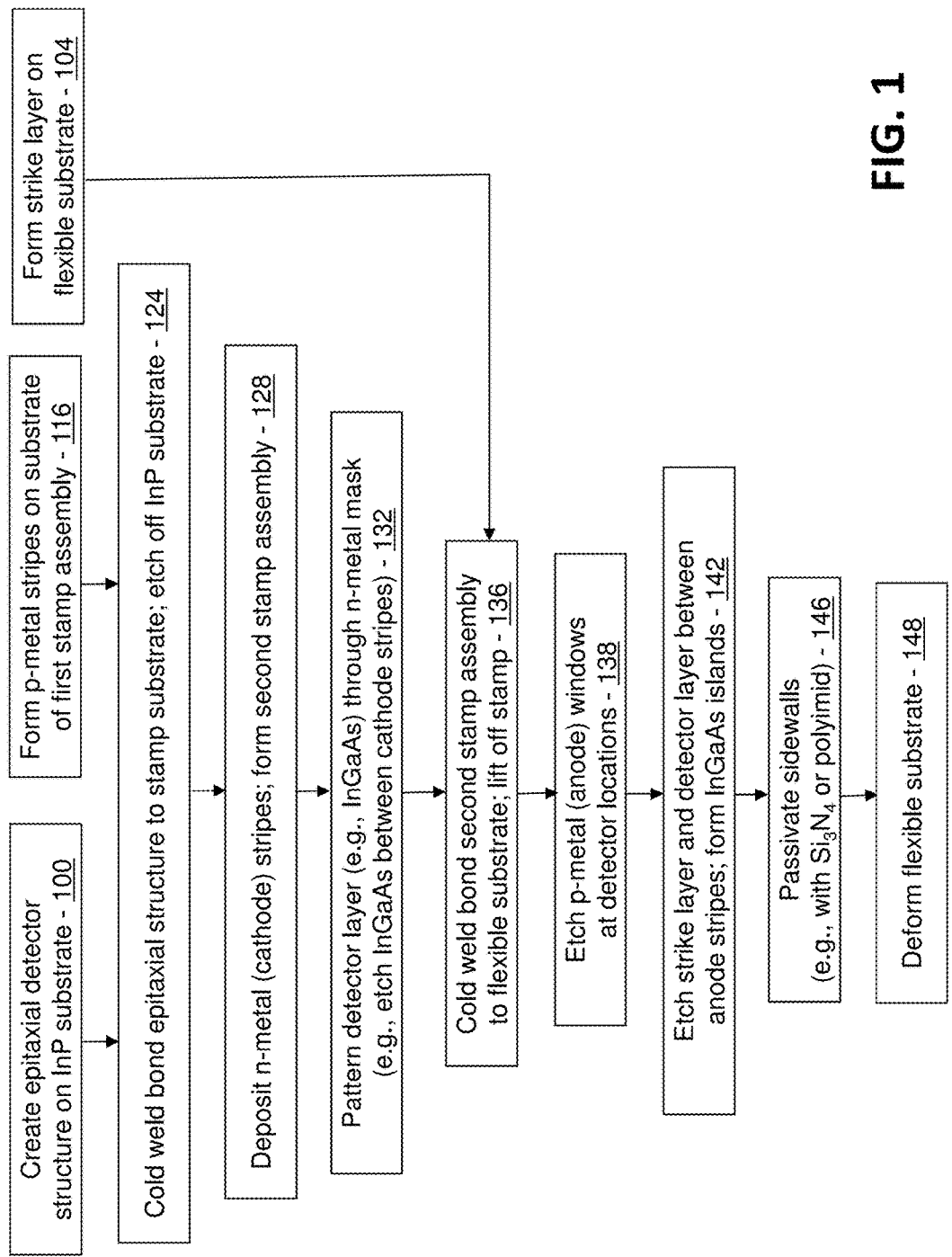
FIG. 1 is a flow diagram of an exemplary method of fabricating a photodetector on a three-dimensionally curved substrate in accordance with one embodiment and one or more aspects of the disclosure.

With reference now to the drawing figures, FIG. 1 shows an exemplary process flow in accordance with one embodiment of the disclosed methods for fabricating an optoelectronic device (e.g., a photodetector or focal plane array of photodetectors) having an inorganic semiconductor detector and a three-dimensionally contoured substrate. Cross-sections of a number of the intermediate structures fabricated during the process flow are shown in FIGS. 2-10A. The resulting optoelectronic device is shown in FIG. 10B.

Figure 2:
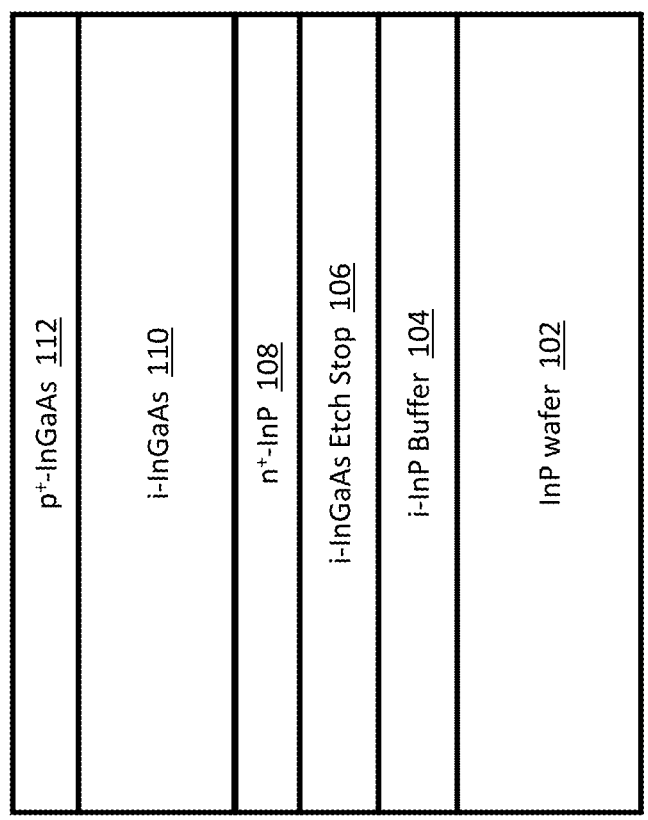
FIG. 2 is a schematic, sectional representation of an exemplary epitaxial photodetector structure created during implementation of the fabrication method of FIG. 1.

The process flow begins with the creation in a step 100 of an epitaxial photodetector structure (or stack) on a sacrificial semiconductor substrate ("the growth substrate") 102, as shown in FIG. 2. In this example, the epitaxial photodetector stack is configured as a p-type/intrinsic/n-type (PIN) InGaAs detector stack. The stack includes an intrinsic buffer layer 104 disposed on the growth substrate 102. The intrinsic buffer layer 104 may be an InP layer having a thickness of about 0.2 µm. An intrinsic etch stop layer 106 may be grown on the intrinsic buffer layer 104. The intrinsic etch stop layer 106 may be an InGaAs layer having a thickness of about 0.2 µm. An n-type InP layer 108 may be grown on the intrinsic etch stop layer 106. The n-type InP layer 108 may have a thickness of about 0.3 µm and a dopant concentration level in a range from about $10^{18}$ to about $10^{19}$. An intrinsic InGaAs absorption layer 110 may be grown on the n-type InP layer 108. The intrinsic InGaAs absorption layer 110 may have a thickness of about 1.5 µm. A p-type InGaAs layer 112 may be grown on the intrinsic InGaAs absorption layer 110. The p-type InGaAs layer 112 may have a thickness of about 0.3 µm and a dopant concentration level of about $10^{18}$.

The configuration, materials, and other characteristics of the above-described photodetector stack may vary. For example, the above-referenced intrinsic layers of the epitaxial photodetector stack may be undoped or not intentionally doped. The dopant concentration levels of the doped layers of the stack may vary. The thicknesses of the layers may vary as well. The layers of the photodetector stack may be based on other materials systems, such as Si in a SOI format in which the buried insulator acts as a release layer as described below. One or more layers of the photodetector stack thus need not be epitaxial layers, any may instead be configured via diffusion or implantation doping, oxidation, etching, passivation, and/or other processing techniques (e.g., standard Si processing techniques). The materials system may alternatively be a GaAs system, in which, for instance, AlAs is used as a release layer. The materials system may also be based on a number of other Group III-V, Group II-VI, or metal-oxide based semiconductors. As described below (see, e.g., FIG. 16), the photodetector structure may be combined with one or more components or devices (e.g., transistor and other active devices) to for an active pixel, in which case the layers of the photodetector and other devices may be incorporated into the epitaxial stack at the growth phase.

The configuration of the epitaxial photodetector stack may vary. For example, one or more additional etch stop and buffer layers may be incorporated into the stack. As described below, the epitaxial structure may include additional layers for other active devices, such as transistors, for control of the photodetector at the pixel level.

The materials of the epitaxial photodetector stack may vary from the InP and InGaAs layers shown. For example, the substrate 102 may include one or more Group III-V semiconductor epitaxial materials (e.g., GaAs, GaSb, InP, AlAs, etc., including any of the ternary, quaternary, and quinternary combinations thereof). The epitaxial layers are not limited to Group III-V semiconductors, as the epitaxial structure may include one or more Group II-VI semiconductor layers (e.g., CdTe, CdSe, etc., including any of the ternary, quaternary, and quinternary combinations thereof).

Figures 3A, 3B:
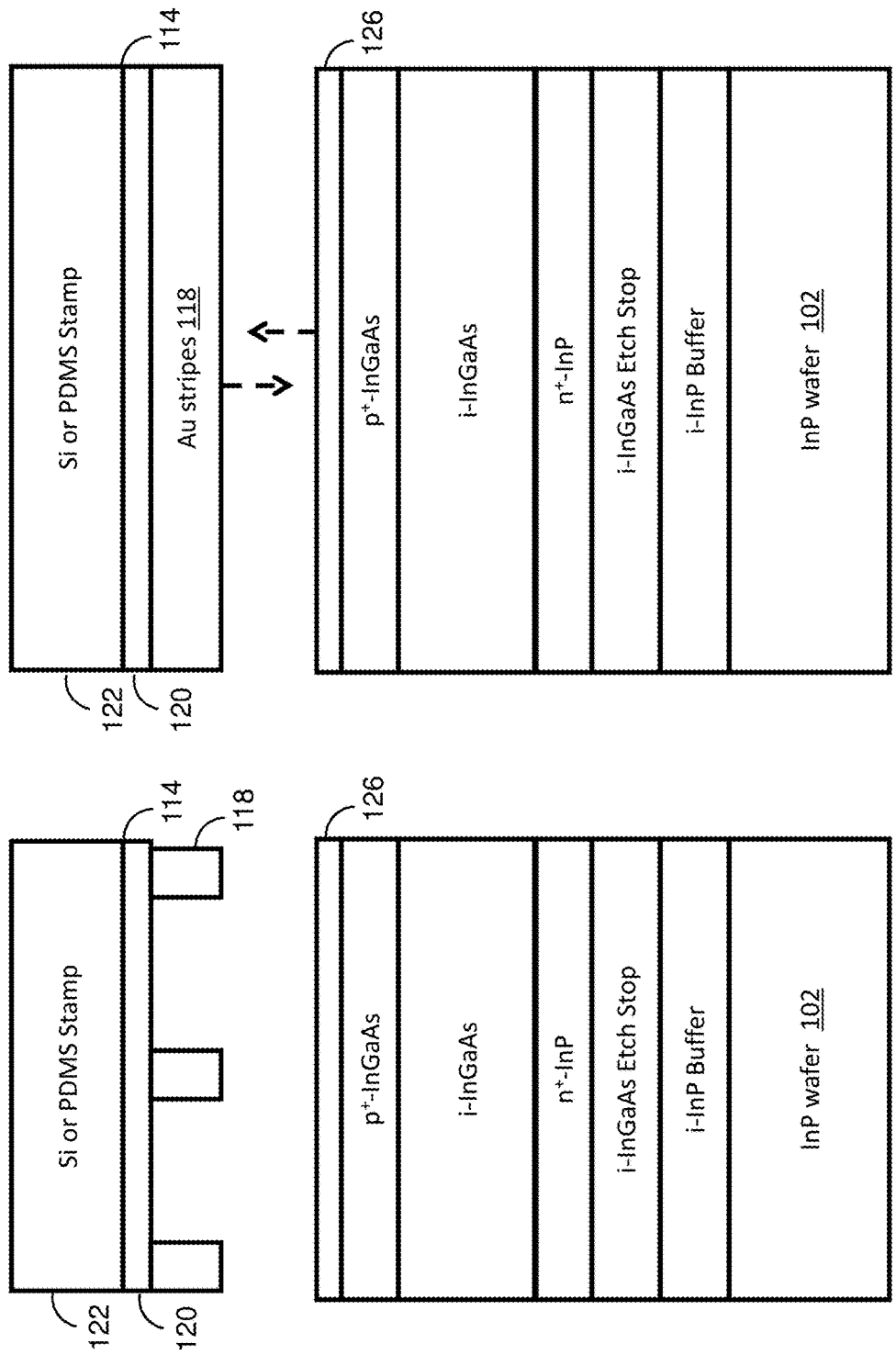
FIGS. 3A and 3B depict respective schematic, sectional views of a cold weld bonding step of the fabrication method of FIG. 1 involving a first stamp assembly and the epitaxial photodetector structure of FIG. 2.

With reference to FIGS. 3A and 3B, the exemplary process flow also includes the formation of a first stamp assembly 114 in a step 116 (FIG. 1) having anode (or p-metal) contact lines or stripes 118 disposed thereon. In this example, the anode contact stripes 118 are arranged in rows (or columns) as shown in FIG. 3A to run as interconnects between adjacent photodetectors in an array. In this example, the anode contact stripes 118 include gold (Au). Alternative or additional materials may be used. The anode contact stripes 118 may be disposed upon an adhesion reduction or separation layer 120 to facilitate the eventual separation of the anode contact stripes 118 from a sacrificial substrate 122 of the stamp assembly 114. The adhesion reduction layer 120 may include one or more of, for example, fluorocarbons (e.g., Teflon), silicon dioxide, photoresist, or other materials. The sacrificial substrate 122 of the stamp assembly 114 may be a silicon wafer or be formed of a desired semiconductor or other handling material, such as poly-dimethyl-siloxane (PDMS). As described and shown herein, the use of the stamp assembly 114 enables the subsequent transfer of the epitaxial photodetector stack to a flexible substrate in an orientation that corresponds with the orientation of the devices on the original wafer, or growth substrate 102. In this way, the bottom of the device on the growth substrate 102 corresponds with the bottom of the device once transferred to the flexible substrate.

FIGS. 3A and 3B depicts a step 124 (FIG. 1) of the exemplary process flow in which the stamp assembly 114 is attached to the epitaxial photodetector stack via a cold weld or other bond. In this example, a p-metal (e.g., Au) strike layer 126 is deposited on the epitaxial photodetector stack. The strike layer 126 and the anode contact stripes 118 are pressed against one another under low temperature, high pressure conditions. Once a suitable bond is formed, the InP growth substrate 102 of the original wafer is removed via an etching or lapping procedure of the step 124. As shown in FIG. 4, removal of the bulk of the InP growth substrate 102 leaves the epitaxial photodetector stack disposed on the sacrificial substrate 122 of the stamp assembly 114. One or more non-active layers of the epitaxial photodetector stack may also be removed in the step 124. In this example, the buffer and etch stop layers are removed as shown in FIGS. 4A and 4B, leaving only the PIN layers of the epitaxial photodetector stack on the stamp assembly 114.

Figures 5A, 5B:
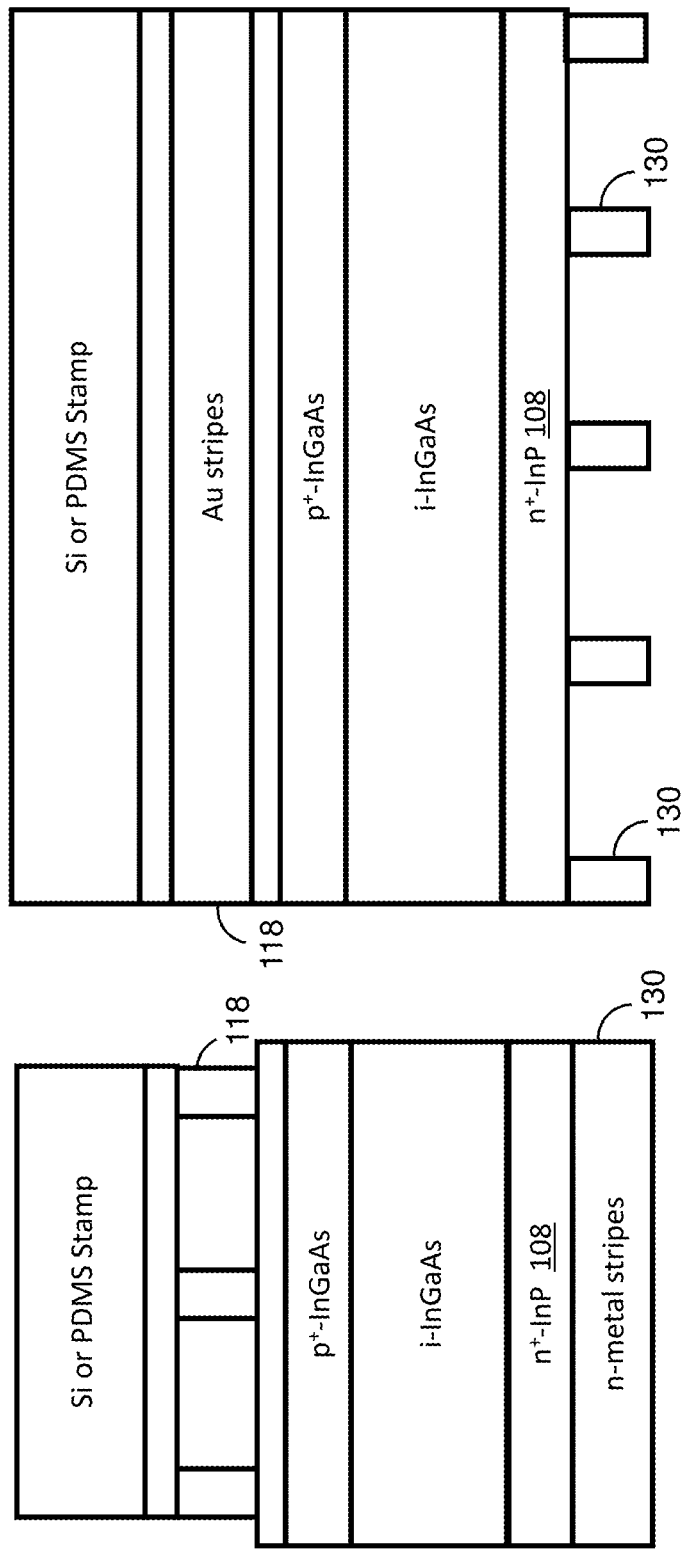
FIGS. 5A and 5B depict respective schematic, sectional views of the epitaxial photodetector structure of FIG. 1 after deposition and patterning of cathode (or n-metal) stripes of the fabrication method of FIG. 1, thereby forming a second stamp assembly in accordance with one embodiment.

FIGS. 5A and 5B show a step 128 (FIG. 1) in which n-metal cathode contact stripes 130 are deposited on the detector stack. In this example, the n-metal cathode stripes 130 are deposited on the n-type InP layer 108. The deposition of the n-metal cathode contact stripes 130 establishes a second stamp assembly. The step 128 may include the deposition of one or more metal layers. For example, the metal layer(s) for the n-metal cathode contact stripes 130 may include any one or more of Ni, Ge, Ti, Au, Pt, Cr, Zn, W, etc. The metal layer(s) is then patterned via an alignment step into the n-metal cathode contact stripes 130. The n-metal cathode contact stripes 130 may be arranged as columns (or rows) as shown. In this example, the n-metal cathode contact stripes 130 are configured as columns oriented perpendicularly relative to the rows of the anode contact stripes 118 described above.

FIGS. 6A and 6B show the patterning of the PIN layers of the detector stack via an etch step 132 (FIG. 1) that uses the cathode contact stripes 130 as a mask. The InGaAs and InP layers 108, 110, 112 of the detector stack may be etched between the cathode contact stripes 130 via a dry etch (e.g., reactive ion etch) process relying on, for instance, methane or Boron trichloride ($BCl_3$).

Figures 7A, 7B:
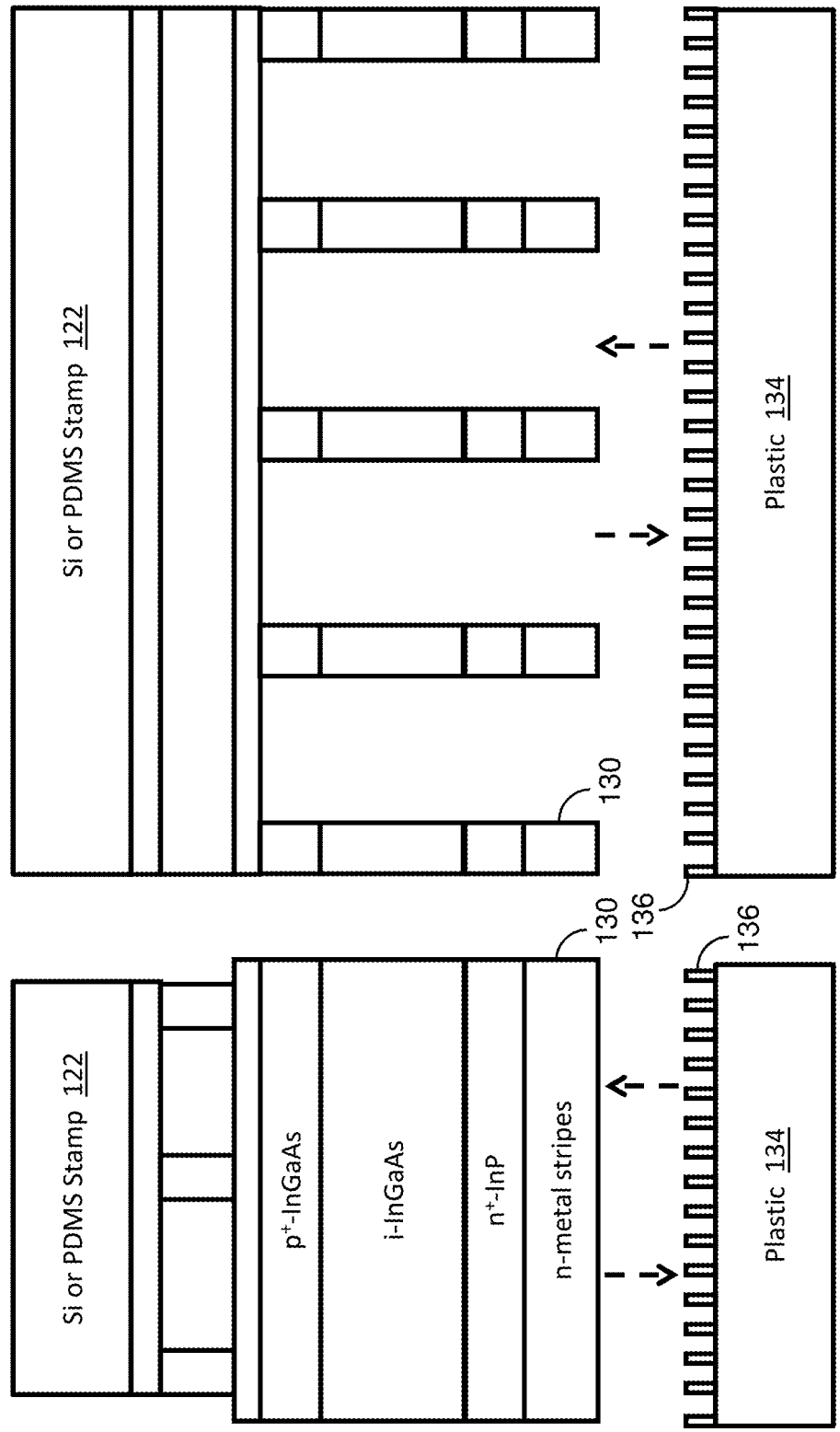
FIGS. 7A and 7B depict respective schematic, sectional views of bonding and stamp lift-off steps of the fabrication method of FIG. 1 in which the stamp assembly of FIG. 5 is attached to a flexible substrate via a cold weld bond between the cathode stripes and a strike layer on the flexible substrate in accordance with one embodiment.

The resulting stamp assembly is then permanently attached to a flexible substrate 134 as shown in FIGS. 7A and 7B via another cold weld bond step 136 (FIG. 1). To this end, the flexible substrate 134 has a metal strike layer 136 disposed thereon. In this case, the strike layer 136 includes an arrangement of n-metal (or other metal) islands configured to support the detector stack above the flexible substrate 134 without shorting out the cathode contact stripes 130 to one another. Each island of the strike layer 136 may include one or more metal layers. In one example, the islands of the strike layer 136 includes a gold (Au) layer having an approximate thickness of 50 Å of Au for cold welding, and further includes a thin adhesion layer of Cr, Ti, or some combination thereof having an approximate thickness of 50 Å. Upon attachment to the flexible substrate 134, the sacrificial substrate 122 of the stamp assembly is lifted off or otherwise released to complete the substrate transfer. To that end, the adhesion reduction layer 120 of the sacrificial substrate 122 may include Teflon, $SiO_2$, photoresist, or other material(s) to establish an adhesion strength lower than the adhesion between the strike layer 136 and the flexible substrate 134 to ensure that separation from the sacrificial substrate 122 occurs. In some examples, the release of the sacrificial substrate 122 involves implementing an epitaxial lift-off procedure.

The construction, configuration, materials, and other characteristics of the flexible substrate 122 may vary. For example, further layers may be incorporated into the flexible substrate 122 in addition to the layers shown. The flexible substrate 122 may include a plastically deformable substrate made of a variety of different plastic materials, including, for instance, Kapton, PDMS, PET, PETg, FEP, PFA, etc.

Figure 8B:
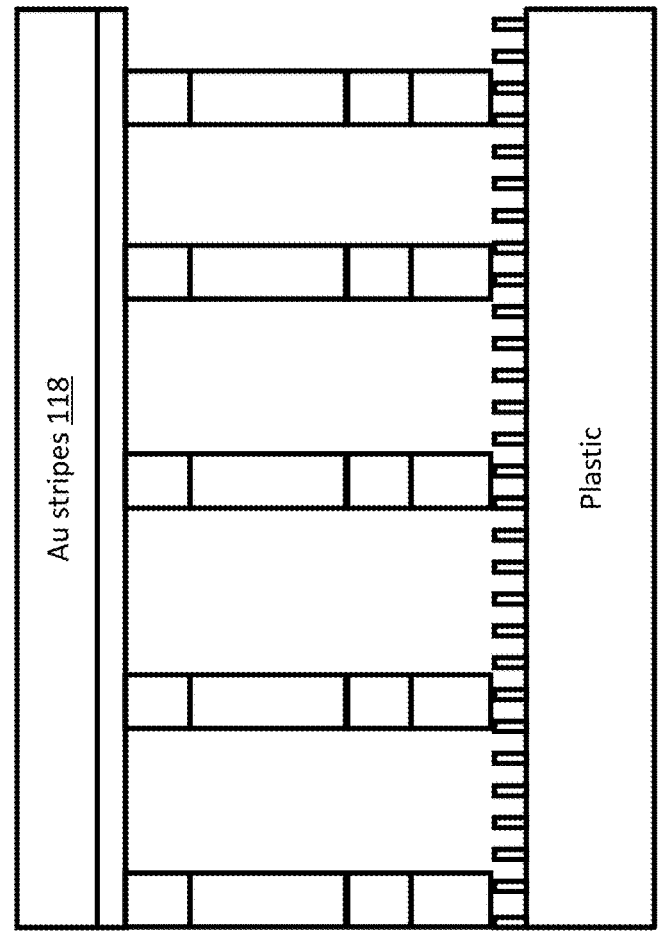
FIGS. 8A and 8B depict respective schematic, sectional views of a flexible detector structure resulting from the fabrication steps of FIG. 7 and after windows are etched in an anode (or p-metal) contact layer in accordance with the fabrication method of FIG. 1.
Figure 8A:
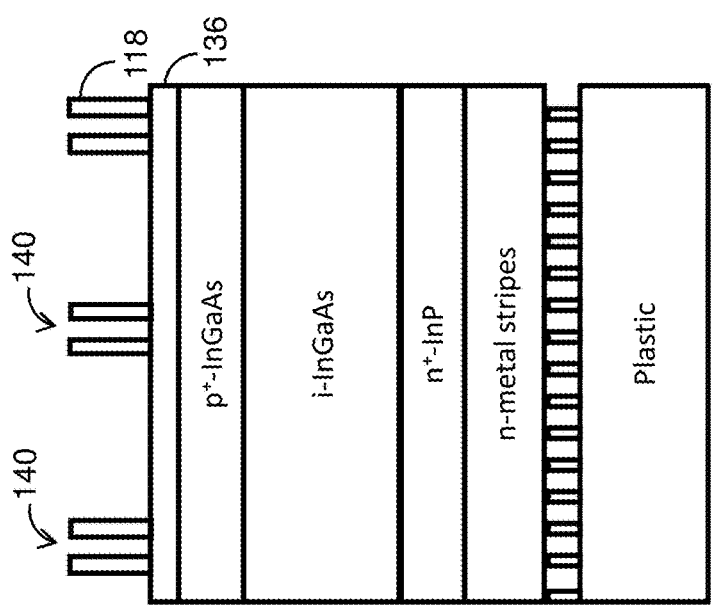

FIG. 8 shows an anode (p-metal) etch step 138 (FIG. 1) in which windows 140 are formed in the anode contact stripes 118 via an alignment procedure directed to establishing the position of each detector. The resulting windows 140 and the underlying detector pixels are also shown in FIG. 10A.

Turning to FIGS. 9A and 9B, an etch step 142 (FIG. 1) may then be implemented to remove the strike layer 136 (FIG. 8A) that remains disposed upon the detector stack between the anode contact stripes (e.g., rows) 118. The etch step 142 may include a dry etch step using, for example, Argon plasma. The ohmic contact layer 112 of the detector stack is thereby exposed, allowing a further etch procedure of the step 142 using, for example, methane or $BCl_3$, to pattern the detector stack into islands or mesas 144 as shown. The anode contact stripes 118 are used as a mask such that the InGaAs and InP layers 108, 110, 112 of the mesas 144 are left only at each overlap of the column and row contact strips 118, 130, as best shown in FIG. 10A. This may involve or include patterning, for instance, a photoresist layer over the windows (described below) so that one or more epitaxial layers are not etched through the window. Alternatively, the metal etch to define the window may be performed after etching to form the mesas 144, such that the anode stripe alone may be used to mask the mesas.

The fabrication method may vary from the example described above. For example, in some embodiments, the strike layer 136 on the flexible substrate 134 is not pre-patterned into islands (as shown in FIGS. 7A and 7B). In such cases, another etch step (e.g., Argon plasma) may be performed to isolate the islands 144 of the detector stacks by removing the strike layer 136 from the flexible substrate 134 while using the islands 144 as a mask.

The order of the steps of the above-described fabrication methods may vary. For example, the detector stacks may be patterned into islands or mesas at a different stage in the fabrication process flow. For example, using an alignment step, individual photodetector mesas may be formed before the deposition of the anode contact layers. Reordering the process flow steps in this optional manner may significantly increase strain tolerance (or absorption). Further details regarding possible methods or designs for managing strain are set forth in connection with FIGS. 29A-29C and 30.

A number of additional process steps or procedures may be incorporated into the above-described fabrication method. For example, the process flow may also include a passivation step 146 (FIG. 1) in which sidewalls of the above-described structures (photodetector stacks, contact stripes, etc.) are coated with a passivation layer, such as silicon dioxide ($SiO_2$), silicon nitride ($Si_3N_4$) or polyimide. Such sidewall passivation may help avoid spurious contact between layers or components after deformation of the flexible substrate 134 to the desired shape for the array of photodetectors. The process flow may include any number of post-transfer or post-attachment steps (e.g., after the device structures are attached to the flexible substrate) in which one or more features of the disclosed devices are created or fabricated. Such post-attachment fabrication may be useful for creating interconnects or other features on a backside of the photodetector or other device stack that was inaccessible until after the removal of the sacrificial substrate.

FIGS. 10A and 10B depict one example of a deformation step 148 (FIG. 1) in which the flexible substrate 134 is deformed into a hemispherical or other three-dimensional contour. The deformation may rely on a semi-rigid plastic material (e.g., Kapton®, PET, PETg, FEP, PFA, etc.) for the flexible substrate 134 that, upon heating, becomes more pliable as its glass transition temperature is approached. A vacuum mold or chuck or other apparatus (e.g., one providing positive pressure) may be used to shape the flexible substrate 134 as desired. In some examples, the vacuum mold has a hemispherical recess. Cooling the structure then results in the plastic material of the flexible substrate 134 retaining the desired shape.

Establishing the desired contour or shape of the optoelectronic device may involve a variety of other setting or other fixing operations. For example, rather than the aforementioned plastic deformation, a resiliently or otherwise flexible substrate is instead temporarily deformed to match the shape of a lens or other system component. The optoelectronic device shown in FIG. 10B may then be mounted on or in the lens. In such cases, the flexible substrate 134 may be a PDMS or other elastic stamp.

Deformation of the optoelectronic device as shown in FIG. 10B may subject components of the device to strain. Much, if not all, of the strain resulting from the deformation may be generally handled by the interconnects running between the islands 144, or detector stacks, sparing the islands 144 from damage. One or more aspects of the optoelectronic device may lead to the deformation strain stretching the interconnect rather than pixel structures. For example, the n-metal structures disposed on the flexible substrate 134 may slip along the flexible substrate. With such slippage, the anode (column) and cathode (row) contact stripes 118, 130 are thus subjected to the deformation strain instead of the islands 144 of the detector stacks. The islands 144 may be configured to facilitate the shear slippage on the surface of the flexible substrate 134. In one example, each island 144 includes an adhesion reduction layer to allow such shear slip. The adhesion reduction layer may be interposed between the n-metal layer and the substrate to allow greater shear slip, which may, in turn, allow a higher density of photodetector devices to maximize the fill factor.

The largely one-dimensional nature of the anode and cathode contact stripes 118, 130 may also prevent the deformation from causing damage. Because the contact stripes 118, 130 are shaped as thin strips or stripes, the interconnects absorb the deformation strain without wrinkling or breakage. The anode and cathode contact stripes 118, 130 may fall within a broad thickness range, e.g., from approximately 50 nm to approximately 1 µm.

To the extent that the detector stacks experience any strain from the deformation step, the thin, epitaxial nature of each stack may provide some flexibility and, thus, prevent performance-inhibiting damage. For example, thin InP solar cells transferred to the plastic substrate 134 may exhibit such flexibility.

A number of alternative process flows for fabrication of detector arrays on three-dimensionally curved substrates are now described. Some of the process flows are directed to alternative device configurations and structures.

Figure 11:
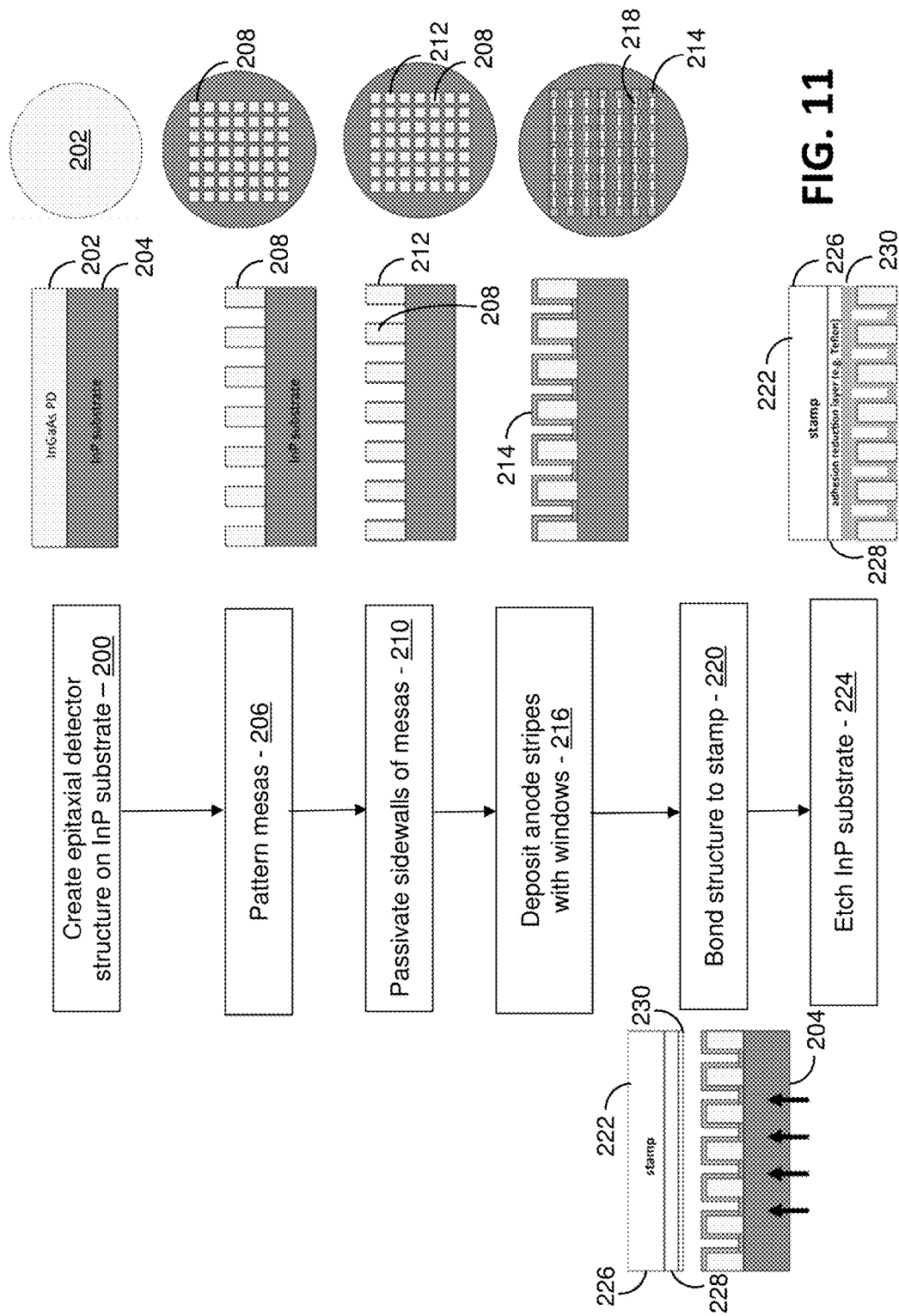
FIGS. 11 and 12 are flow diagrams with corresponding schematic, sectional views of another exemplary method of fabricating a photodetector on a three-dimensionally curved substrate in accordance with one embodiment and one or more aspects of the disclosure.
Figure 12:
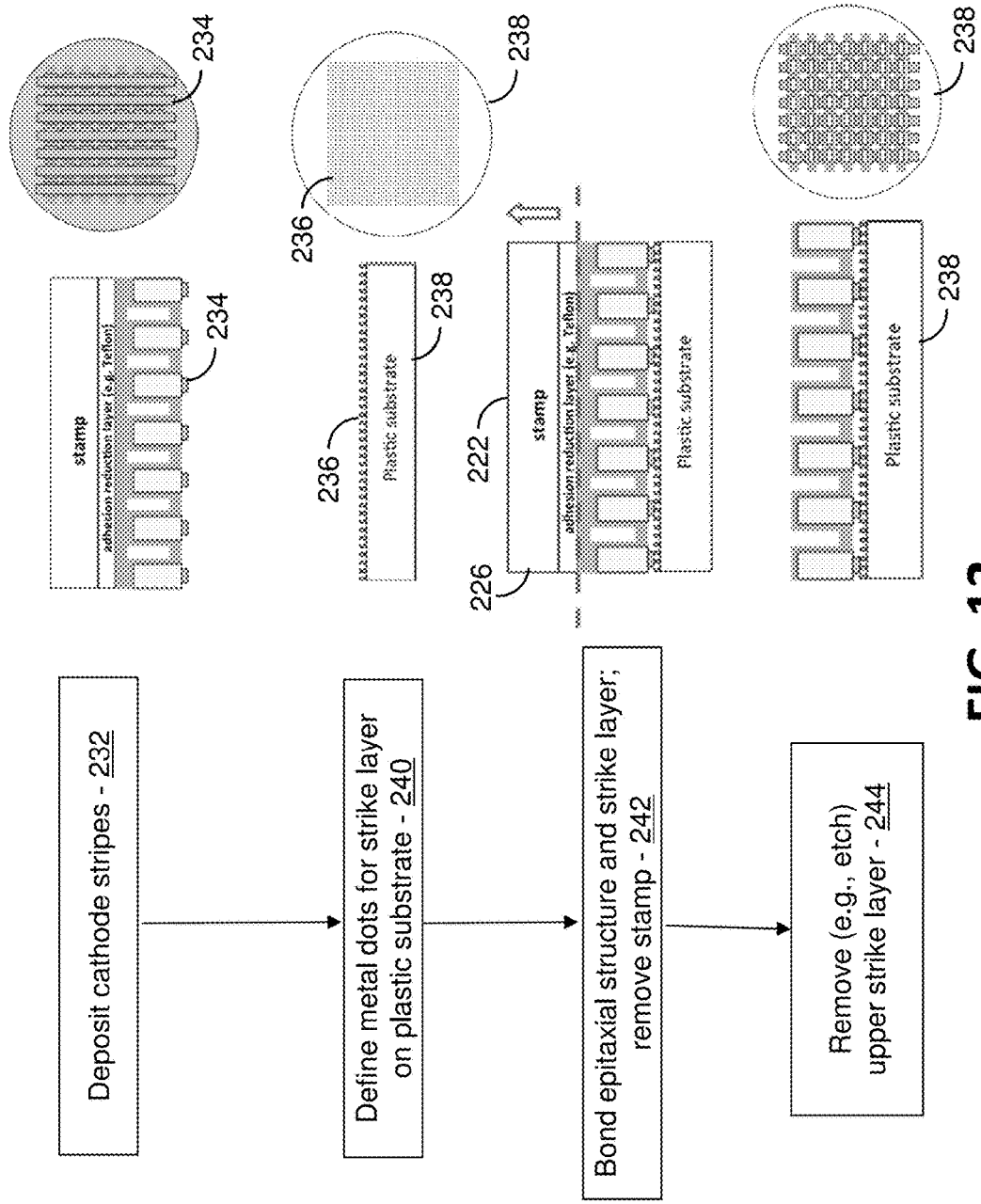

FIGS. 11 and 12 depict another exemplary process flow for a method of fabricating hemispherical and other three-dimensionally shaped photodetector arrays. In this case, the cathode contacts are patterned while the anode contacts are exposed, in contrast to the above-described example. While this approach calls for more strict alignment tolerances, the nature of the anode contacts may lead to the potential for increased deformation tolerance and further strain resistance.

With reference now to FIG. 11, the method may begin with the creation in a step 200 of an epitaxial photodetector structure 202 on a semiconductor substrate 204, such as an InP substrate. The layers of the epitaxial photodetector structure 202 are then patterned in a step 206. Thus, this process flow differs from the process flow of the above-described method in that epitaxial inorganic photodetector mesas or islands 208 are defined initially. For example, InGaAs detector structures may be isolated before any deposition or patterning of contact layers. The layers and other characteristics of the epitaxial inorganic photodetector mesas 208 may be similar to the mesas in the example described above. For example, the structure may define a PIN detector mounted on an InP substrate having one or more etch stop or lift-off layers.

Next, in a step 210, sidewalls of the mesas 208 are passivated with one or more passivation layers 212. A variety of dielectric materials may be used to coat the sidewalls, including, for instance, one or more of the above-referenced passivation materials. The sidewall passivation insulate the detector layers of the mesas 208 from an anode contact stripe 214 to be deposited next in a step 216. In this example, each anode contact stripe 214 is configured as a row having a respective window 218 at each detector location as shown.

A bonding step 220 may then be implemented in which the array is attached to a first stamp assembly 222. and the InP substrate is removed via an etching step. The stamping procedure may be followed by a substrate etch step 224. In this way, the detector structures are transferred from the InP substrate 204 to the stamp assembly. The stamp assembly may include a substrate 226, an adhesion reduction layer 228 (e.g., Teflon), and a metal strike layer 230 (e.g., Au) as described above.

The process flow continues as shown in FIG. 12 with a step 232 in which cathode contact stripes 234 are deposited and patterned. The patterning configures the cathode contact stripes 234 as columns. Each cathode contact stripe 234 may be deposited and configured as described above.

A strike layer 236 may be defined on a plastic substrate 238 in a step 240, which need not be implemented at this point in the process flow. The strike layer 236 may be configured as an array of metal dots as described above.

In step 242, the above-described epitaxial and contact structure is attached to the plastic substrate 238 via a cold-weld bonding procedure. The cold weld bond is formed between the metal dots of the strike layer 236 and the cathode contact stripes 234. The step 242 may also include removal (e.g., lift-off) of the substrate 226 of the stamp assembly 222. The metal strike layer 230 of the stamp assembly 222 may then be removed via, e.g., an etch procedure, in a step 244, thereby revealing the individual anode contact rows of the array. The sectional and plan views shown in FIG. 12 in association with the step 244 depict the detector array mounted on the plastic substrate 238 after the removal of the substrate 226 and the metal strike layer 230. The method may then include a deformation step as describe above to configure the array in a desired three-dimensional shape.

The device structure resulting from the fabrication method shown in FIGS. 11 and 12 has anode contacts and interconnects that wrap down the sides of each inorganic semiconductor stack. This configuration differs from the flat (pre-deformation) strip-shaped contact layers of the embodiments described and shown above in connection with FIGS. 1-10. One potential advantage of having the anode (or other) contact layers follow or track the detector stacks is that stress relief mechanisms may be incorporated into the contact layer. The shape and other characteristics of the stress relief mechanisms may vary, insofar as the patterning and formation of the detector mesas is already complete. In one example, the anode contact layer has a pre-deformation profile with rounded or soft corners (e.g., an S-shaped pre-deformation profile) as the contact extends along the row (or column). An S-shaped profile differs from a straight or rectilinear profile in its capability to absorb stress during deformation. For example, an S-shaped interconnect may act as a stress-absorbing spring. The patterning of the anode contact layer (or other interconnect) may lead to a variety of different arrangements for stress absorption during deformation. These stress relief techniques may be done at the top plane of the epitaxial stack (i.e., metal patterned before etching mesas), as well as at the bottom plane of the stack (i.e., metal patterned after etching mesas so that metal wraps down the sides of the mesas). Further details and examples of such stress relief configurations are set forth below in connection with FIGS. 29A-29C and 30.

Figure 13:
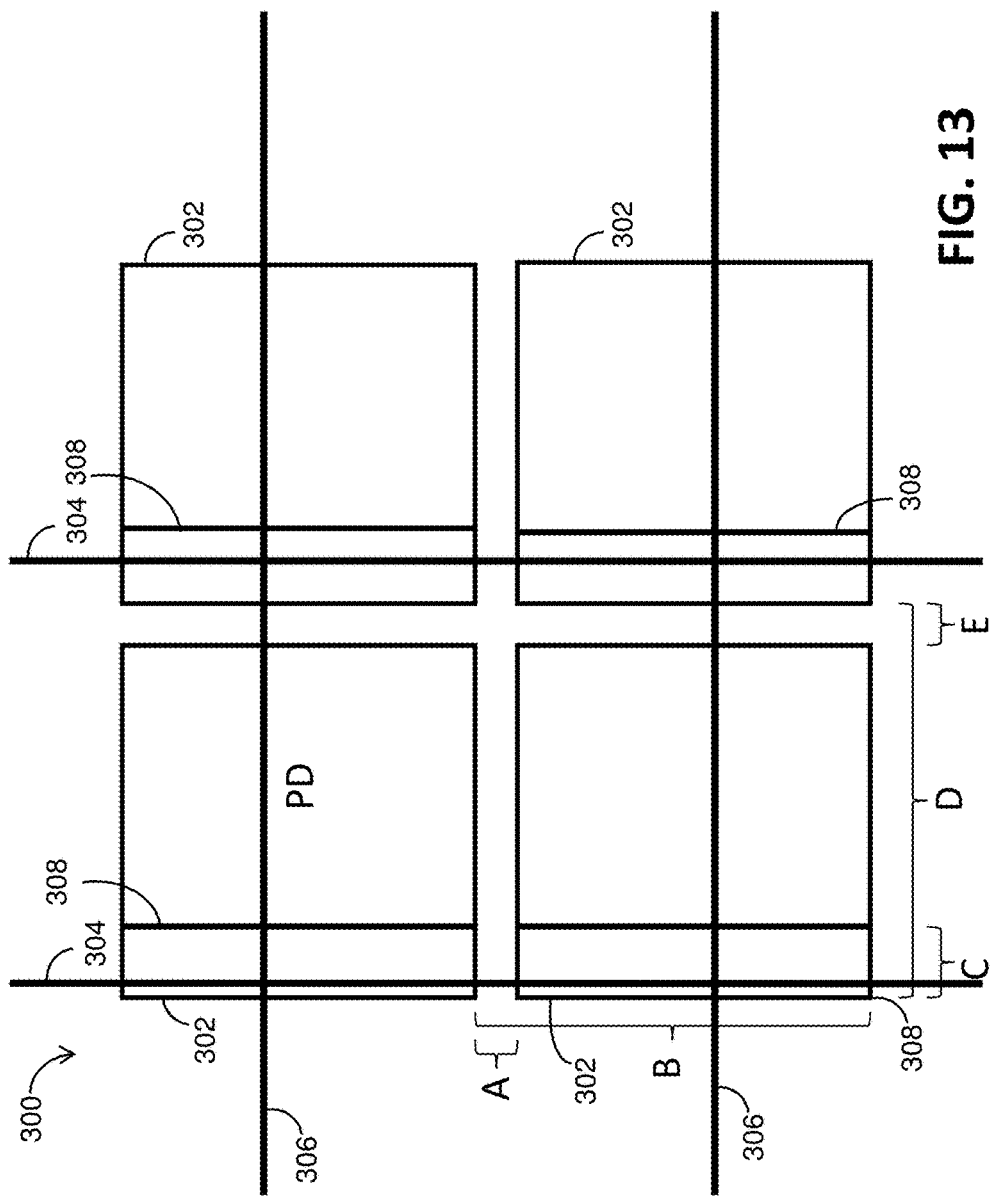
FIG. 13 is a schematic plan view of an another exemplary photodetector array having both anode and cathode contact stripes on a single side and fabricated in accordance with yet another embodiment.
Figure 14:
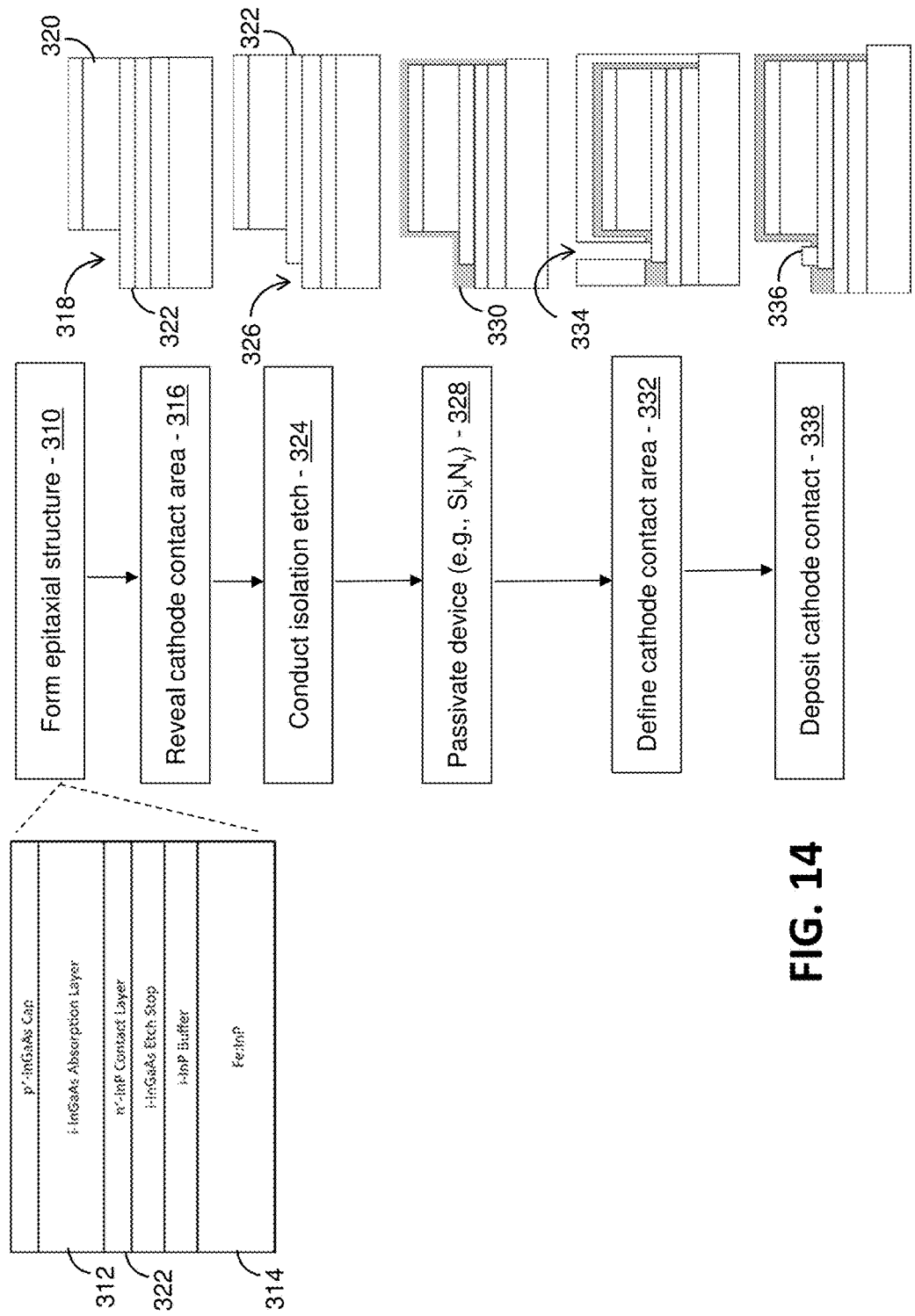
FIGS. 14 and 15 are flow diagrams with corresponding schematic, sectional views of an exemplary method of fabricating a three-dimensionally shaped device having anode and cathode contacts on the same side of a flexible substrate in accordance with one embodiment.
Figure 15:
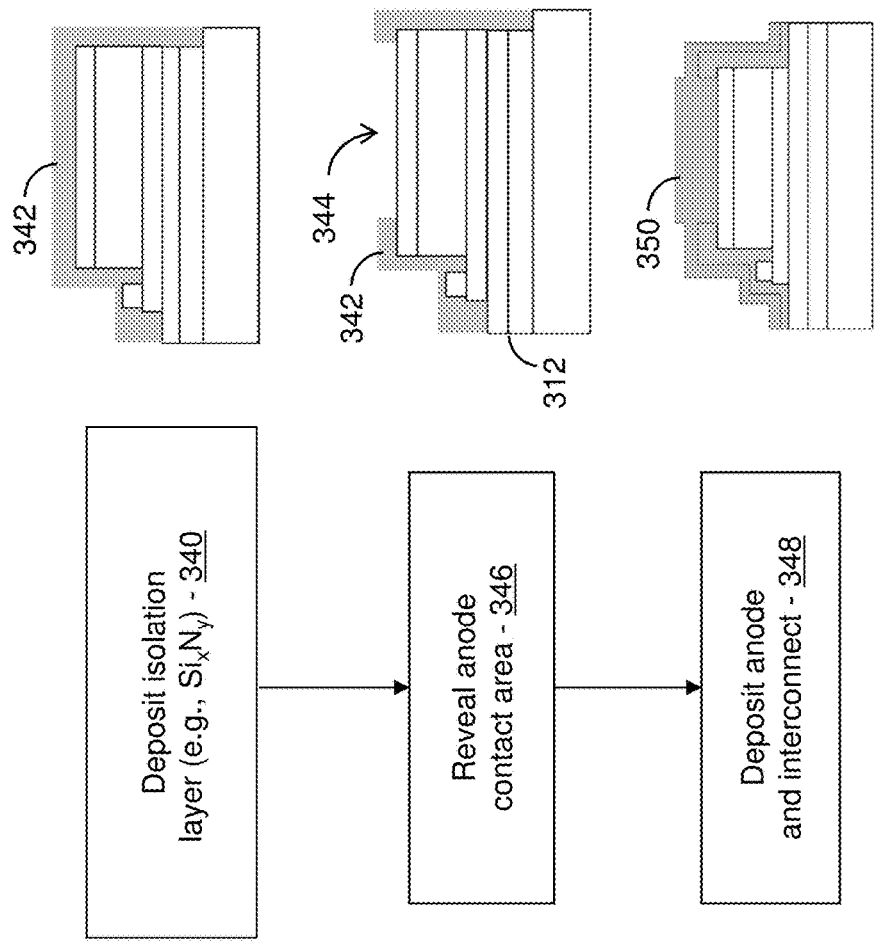

FIGS. 13-15 are directed to a process flow for a method of fabricating three-dimensionally shaped devices having anode and cathode contacts on the same side of the detector stack. Each of the above-described process flows leads to anode and cathode contacts disposed on opposite sides of the flexible substrate. To position both contacts on the same side, the process flow is based on a modified detector layout and a stamping procedure for direct transfer to a plastic substrate, thereby removing the first stamp assembly (e.g., the Si stamp) from the process flow.

FIG. 13 shows a four-pixel arrangement for an array 300 of photodetectors 302 with cathode interconnects 304 and anode interconnects 306 in columns and rows, respectively. The cathode interconnects 304 are disposed such that each pixel has a cathode contact 308 disposed along a lateral side of the pixel structure. To that end, each pixel devotes a portion of its surface area to establishing the cathode contact 308. As shown and described below, each cathode contact 308 generally involves etching down to an epitaxial layer to be used as a transport layer that reaches the bottom of the photodetector. With some of the mesa devoted to the cathode contact 308, the photodetectors of this embodiment may have a smaller size relative to the photodetectors of the above-described embodiments.

The surface area devoted to the cathode contacts 308 may vary. In the example shown in FIG. 13, adjacent rows of the photodetector 302 may be spaced from one another by a distance A, which may be about 5 µm to about 10 µm. Each row may have a width B of about 135 µm. A width C of each cathode contact 308 may be about 20 µm. In this example, each photodetector 302 is square-shaped, such that each column may have a width D, the other lateral dimension of each photodetector, sized similarly to the row width B. Spacing E between adjacent columns may thus match the distance A. The dimensions and shape of the photodetectors 302 and the cathode contacts 308 may vary from the example shown.

FIG. 14 depicts an exemplary method of fabricating the pixel arrangement of FIG. 13. The method begins with a step 310 in which an epitaxial photodetector structure 312 is formed on a sacrificial substrate 314. In this example, the substrate 314 is an iron doped InP wafer, which may be used in connection with any of the embodiments described herein. As in the examples described above, the epitaxial photodetector structure 312 includes inorganic semiconductor materials. The epitaxial photodetector structure 312 may have one or more inorganic semiconductor detector layers in common with the above-described examples. The configuration of the epitaxial photodetector structure 312 may have other characteristics or features in common with the above-described examples. For instance, the epitaxial photodetector structure 312 may again be configured as a PIN detector.

In step 316, a cathode contact area 318 is revealed. In this example, an InGaAs absorption layer 320 is patterned and etched down to expose a portion of a lower Ohmic contact layer 322, which may be an epitaxial InP layer configured as shown. In this way, a conductive connection to the bottom of the photodetector may be established for the cathode interconnect stripes.

An etching step 324 may then be implemented for isolation of adjacent photodetectors in the array. Such isolation may be achieved by etching through and removing the lower Ohmic contact layer 322 in an area 326. A passivation step 328 may then coat the sidewalls of the photodetector structure 312 via, e.g., deposition of a $Si_xN_y$ or other passivation layer 330. As a result, the cathode contact is not shorted to the PIN detector layers.

The cathode contact area 326 is defined and again revealed in a step 332 by etching an opening or hole 334 in the passivation layer 330. The step 332 includes implementation of a cathode contact reveal photolithography step in which the opening 334 is formed. A cathode column 336 may be deposited in a step 338 via, for instance, evaporation of an n-type metal layer. In one example, the cathode column 336 includes layers of Ge (270 Å), Au (450 Å), Ni (215 Å), and Au (450 Å). The materials and layer thicknesses may vary.

The fabrication method continues as shown in FIG. 15 with a step 340 in which a thick passivation or isolation layer 342 is deposited. An anode (p-type) contact area 344 may then be defined in an anode contact reveal step 346 in which the passivation layer 342 is etched at the top of the photodetector structure 312. Other portions of the anode interconnect row, which runs laterally in the sectional view shown, may be defined in a step 348, in which one or more layers are deposited for an anode contact and interconnect 350. In one example, the anode contact/interconnect 350 includes layers of Ti (200 Å), Pt (300 Å), and Au (1000 Å). The materials and layer thicknesses may vary. For example, a combination of Zn and Au layers may be used.

The photodetector structure 312 is then bonded to a flexible (or deformable) substrate, as described above, followed by removal of, or separation from, the substrate or wafer 314 (FIG. 14) on which the photodetector structure 312 is initially formed. One exemplary technique for implementing these steps is described below and shown in connection with FIG. 26.

Figure 16:
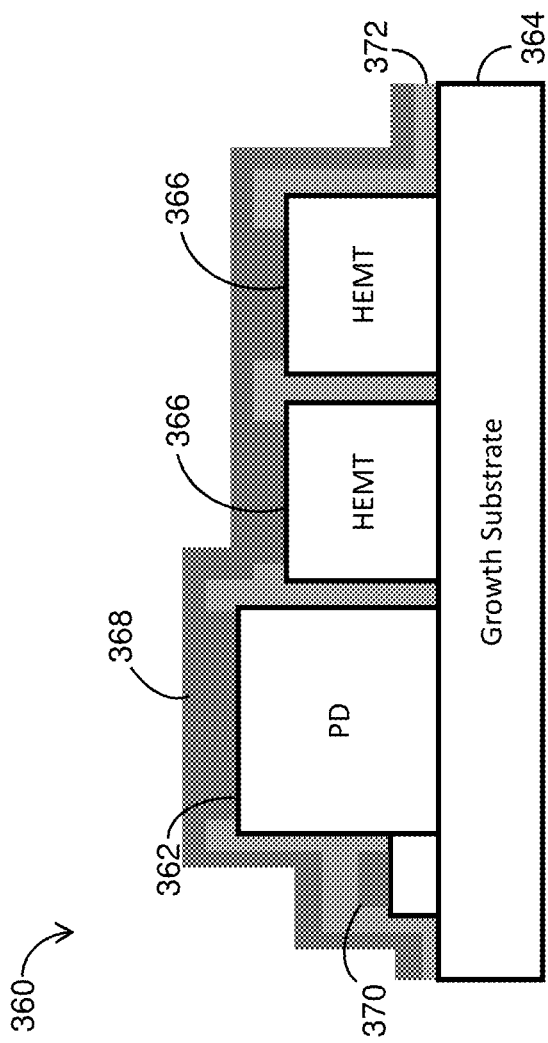
FIG. 16 depicts a schematic, sectional view of an exemplary active pixel device in which an epitaxial photodetector structure fabricated via the method of FIGS. 14 and 15 is connected to a pair of high electron mobility transistors (HEMTs) via an anode contact interconnect in accordance with one embodiment.

FIG. 16 depicts a single pixel of an exemplary active pixel imaging array 360 that may be fabricated via the epitaxial and lithographic processes described above in connection with the embodiment of FIGS. 14 and 15. The imaging array 360 may include any number of such pixels repeated in rows corresponding with the lateral direction of the sectional view, as well as in column transverse to the rows. Each pixel of the imaging array 360 includes a photodetector structure 362 (e.g., the photodetector structure 312 of FIGS. 14 and 15) epitaxially grown on a semiconductor substrate 364 (e.g., an InP or other substrate). Each pixel further includes multiple active elements 366 to support the operation of the active pixel. Anode (row) and cathode (column) contacts/interconnects 368, 370 are disposed on the same side of the photodetector structure 362 and the substrate 364 as described above, which simplifies the processing of the active elements 366 as well as the integration of the active elements 366 and the photodetector structure 362. In this example, the active devices 366 are configured as two high electron mobility transistor (HEMT) devices shown in schematic form to depict a simplified arrangement in which the row interconnect 368 extends over a passivation layer 372 to couple the anode contact 368 of the photodetector structure 362 to a contact (e.g., a drain, source or gate electrode) on one or both of the HEMT devices 366. The process flow is compatible with any combination or layout of transistor devices connected with the photodetector structure 362 to support a variety of circuit arrangements.

Figure 17:
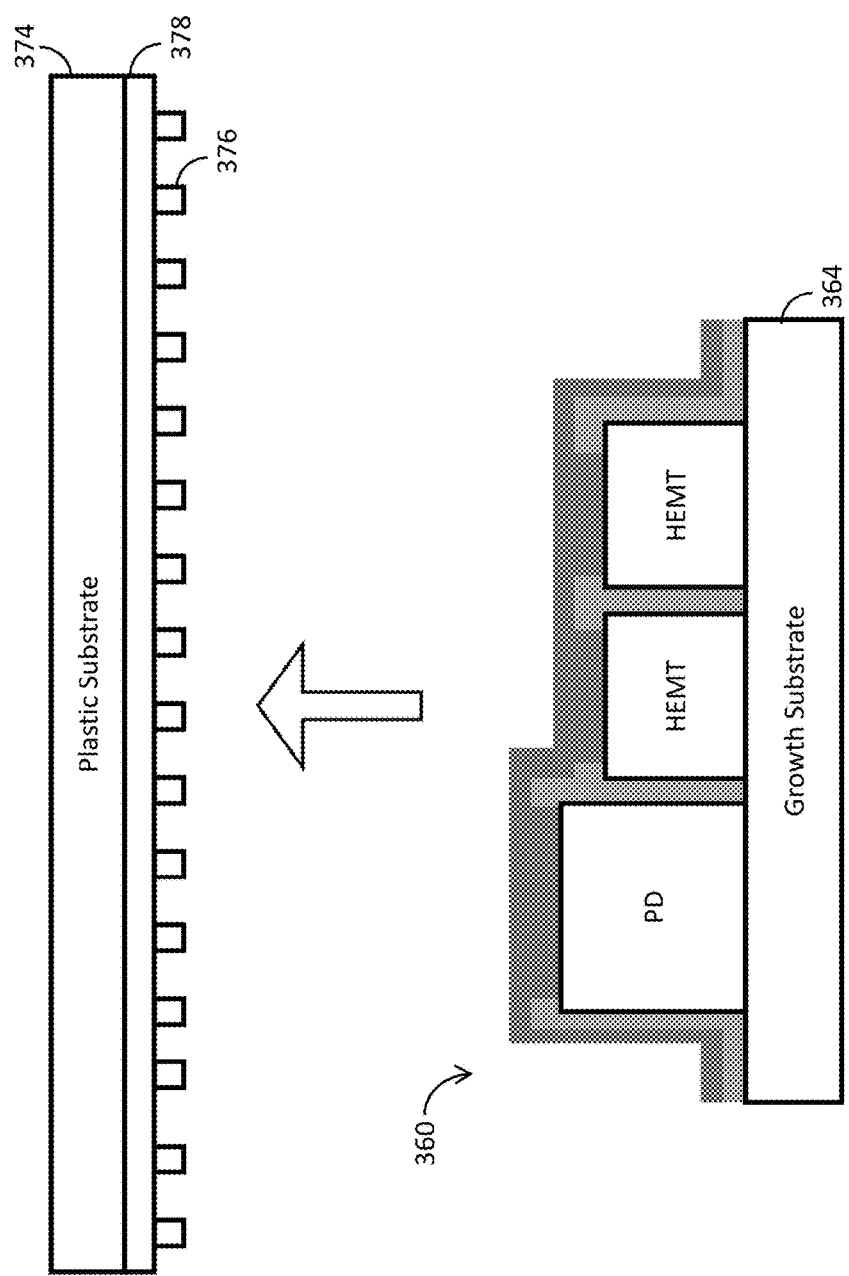
FIG. 17 depicts a schematic, sectional view of the exemplary active pixel device of FIG. 16 before attachment to a plastic substrate via a cold weld bond and removal of the InP substrate via an etching step.

FIG. 17 depicts an exemplary stamping procedure in which the active pixel imaging array 360 (and each pixel structure thereof) is transferred from the InP growth substrate 364 onto a flexible (plastic) substrate 374 having a patterned strike layer 376 and an adhesion reduction layer 378. As described above, the patterning of the strike layer 376 maintains the isolation of the anode contacts and rows 368, while still allowing the strike layer 376 to establish a cold weld bond with the anode contact interconnects 368 to attach the pixel structure to the flexible substrate 374. As described above, the adhesion reduction layer 378 (e.g., Teflon) may be disposed between the flexible substrate 374 and the metal strike layer 376 to enable a small amount of slippage during deformation or transfer to a third substrate.

The completed pixel array 360 is shown in FIG. 18 after the stamping procedure and removal (e.g., etching) of the growth substrate 364 (FIG. 17). Both the anode (row) and cathode (column) contacts/interconnects 368, 370 are disposed on the same side of the photodetector structure 362 and the plastic substrate 374.

FIG. 17 may be representative of an alternative embodiment in which an adhesive material is used to attach the pixel structure to the flexible structure 374. The elements 376 may be representative of a discontinuous distribution of the adhesive material on the plastic substrate 374. One or more adhesive materials may be used, including, for instance, various epoxies or glues, a curable photoresist, silicone, and/or polyimides. The use of such non-conductive materials may simplify the passivation of the conductive layers of the device(s). The adhesive material may be distributed across the flexible substrate 376 in various arrangements or configurations. For example, the adhesive material may be spread or otherwise distributed continuously or more continuously than the example shown in FIG. 17.

In an alternative to the assembly procedure shown in FIG. 17, the fabrication method includes a process flow in which anode and cathode contacts are patterned on the photodetector structures while on the growth wafer, and in which interconnects and bus lines are deposited and patterned on the flexible/deformable substrate. The photodetector structures and the flexible substrate may then be attached to one another using an alignment procedure.

Figure 20:
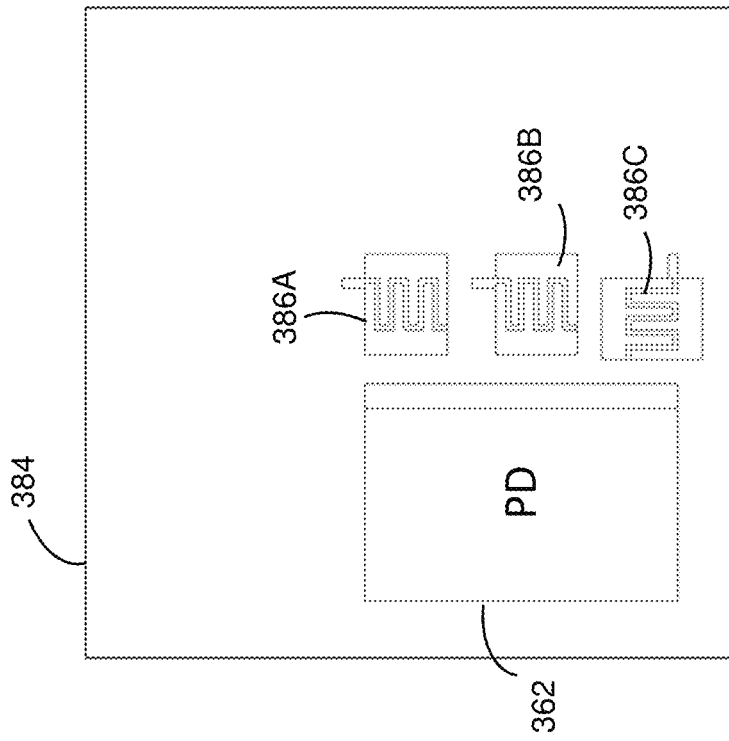
FIG. 20 depicts an exemplary pixel layout of the active pixel device of FIGS. 16-18.
Figure 19:
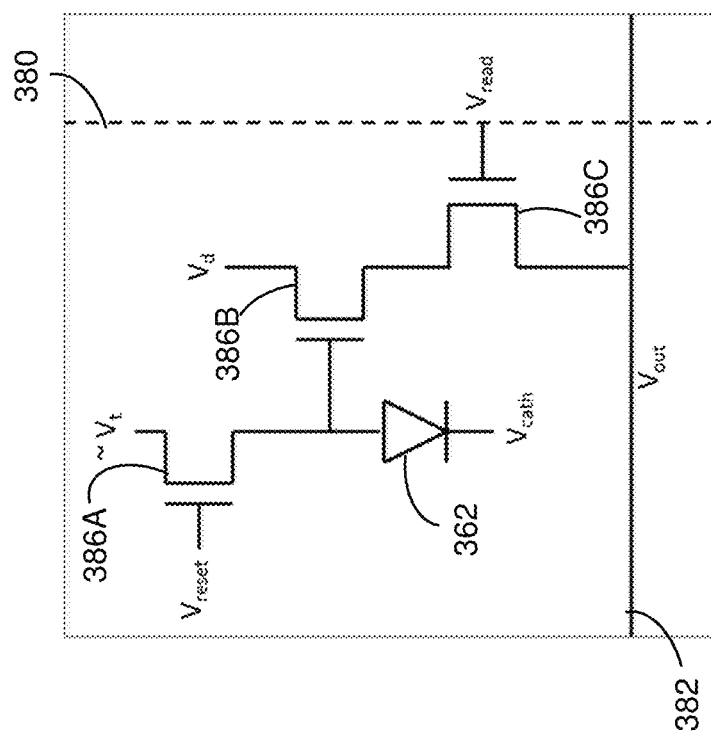
FIG. 19 is a schematic circuit diagram of an exemplary three transistor circuit of the active pixel device of FIGS. 16-18.

FIGS. 19 and 20 depict exemplary circuit and layout arrangements for each active pixel of the array. In this example, a column select line or interconnect 380 is directed to obtaining access to the voltage generated by the photodetector structure 362 (schematically represented by a PIN diode) of the pixel. The photodetector structure 362 may be configured as an InGaAs photodetector as described above. During operation over an array of pixels, the voltage(s) on a number of row interconnects 382 may be evaluated via a selected one of the columns 380. Approximately a quarter of a pixel area 384 is taken up by the photodetector structure 362. Thus, the pixel area 384 of the pixel may be scaled down. In this example, each pixel includes three transistor devices (e.g., HEMT devices) 386A-386C. The transistor device 386A is controlled by a control voltage directed to resetting the photodetector structure 362. The transistor device 386B is configured as an amplifier, while the transistor device 386C is configured as a column select switch.

Set forth are operational parameters for an exemplary device configured as shown in FIG. 20 and having an area of 135 µm². After time $T_{int}$, $V_{g,dark}=V_t+1.6$ mV and $V_{g,10-bit}=V_t+1.6$ V, and with—

$$I_{dsat} = \frac{W\mu C_{ox}}{2L}(V_G - V_t)^2$$

where, $\mu_n \sim 10^4$ cm²/Vs and $V_G < Q_{max}/C_{ox} = 10^{12} q/C_{ox}$, the following current values are achieved: $I_{dsat,dark}=0.4$ mA, $I_{dsat,10-bit}=400$ mA, and $I_{pinch-off} \sim 10$ nA.

Figure 21:
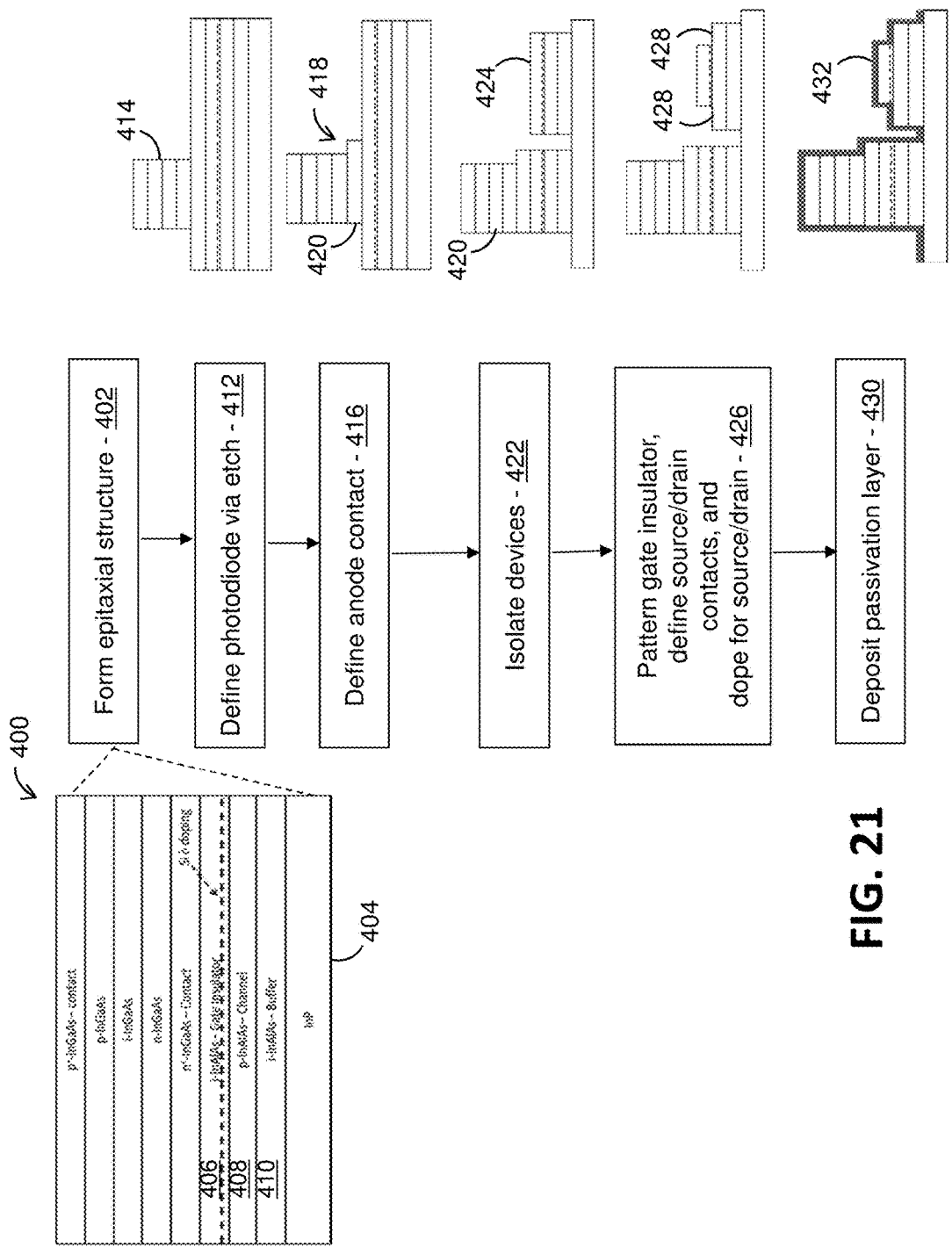
FIGS. 21 and 22 are flow diagrams with corresponding schematic, sectional views of an exemplary method of fabricating an active pixel device in accordance with one embodiment.
Figure 22:
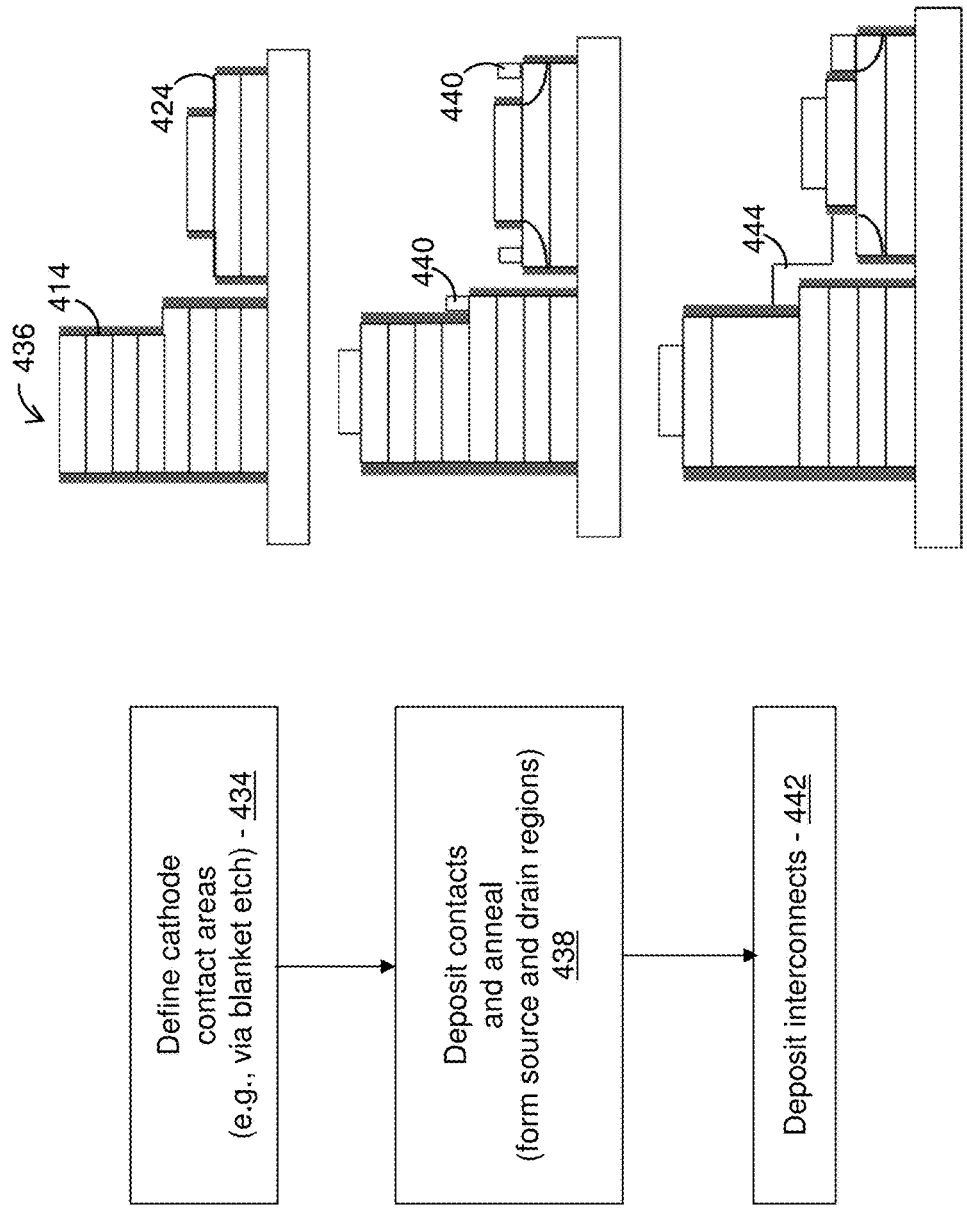

FIGS. 21-22 depict an exemplary process flow that integrates the fabrication of inorganic photodetector and transistor devices to produce an active pixel array on a wafer or other substrate, such as the active pixel array described and shown in connection with FIGS. 16-20. The active pixel array may then be transferred to a flexible or deformable substrate using the processes described above. For ease in illustration, only one of the transistors is depicted. In this case, the reset transistor device 386A of the exemplary circuit of FIGS. 19 and 20 is depicted alongside the photodetector. The amplifier transistor device 386B is not shown, but may be connected to a bottom contact of the photodetector device 362.

The configuration, structure, materials, and other characteristics of the pixels, active elements, or other devices may vary considerably. For example, the devices may include passive pixels or active pixels with two, three, or four transistors. The configuration of the active elements may vary. Examples of suitable types of active elements include HEMT, JFET, MESFET, MOSFET, BJT transistor devices, which may be grown by MBE, LPE, CVD, or CMOS processes. In each of these cases, inorganic devices may be formed on a wafer and transferred to a flexible or deformable substrate using (1) cold-welding to bond the devices to the flexible substrate and (2) etch stop layers, where the entire wafer is etched (or even sacrificial etch layers where we only etch the layer referred to as "etch stop layer" here).

With reference to FIG. 21, an epitaxial structure 400 is formed in a step 402 on a sacrificial (e.g., InP) substrate 404. The epitaxial structure 400 includes layers dedicated to fabrication of the active elements (e.g., transistor layers). In this example, the transistor layers include a gate insulator layer 406, a channel layer 408, and a buffer layers 410. The transistor layers are disposed below the photodetector layers in this case, although the order may be reversed in other embodiments. In embodiments in which some or all of the transistor devices in the pixel design are HEMT devices, the epitaxial formation of the structure 400 may include a dopant implant step implemented as the gate insulator layer 406 is grown. In one example, the implant step may include an Si delta doping step as shown in FIG. 21. The implant step may facilitate the introduction of charge carriers (e.g., electrons) into the InGaAs channel layer 408.

After the epitaxial growth of the structure 400, an etch step 412 may be implemented to define a photodiode structure 414. The etch step 412 removes portions of the n+ contact and absorption layers of the photodetector design (as described above) to define the area in which the photodiode structure 414 is disposed. In another etch step 416, an anode contact area 418 is defined adjacent to the photodetector structure 414. To this end, a portion of a bottom contact layer 420 is exposed or revealed in a manner similar to that described above in the example in which the cathode electrode is disposed below the detector layer.

An isolation step 422 may then be implemented to define and isolate the photodiode structure 414 from one or more transistor structures 424 of the active pixel device. The isolation step 422 may include etching down to the substrate 404.

In a step 426, the gate insulator layer 406 is patterned. The same photolithographic pattern may then be used to define one or more channel layer contacts 428 for source and drain regions of the transistor structure 424 and implant or otherwise introduce (e.g., via diffusion) dopant for the source and drain regions. The exemplary process flow is thus compatible with several ways in which HEMT devices may be formed. Additional p-type doping of the channel contact regions (e.g., to make the contact regions p+) may be performed to improve transistor performance. Such additional doping may be done using the same lithography pattern referenced above. These doped regions are depicted after diffusion into the channel layer after an anneal described below.

The epitaxial structures 414, 426 may then be passivated in a step 430 in which one or more passivation layers 432 is deposited. In this example, all sidewalls of the structures 414 and 426 are passivated in preparation for the metallization steps that form both electrode contacts as well as the row and column interconnects.

With reference now to FIG. 22, the fabrication method continues with a step 434 in which a cathode contact area 436 is revealed via a blanket etch that exposes the top surfaces of both of the structures 414, 426 and thus, both the photodiode and transistor devices. A step 438 may then be implemented in which one or more metal layers 440 are deposited and annealed. The metal layers 440 may be patterned to form contacts for both devices. The annealing of the metal layers may also be used to drive the dopant to define the source and drain regions of the transistor device.

In a step 442, one or more interconnects 444 may be deposited between the photodetector and transistor structures 414, 426. The step 442 may deposit one or more metal layers to form the row, column, and other interconnects. At this point, the fabrication of the pixel array is complete, and the device is ready for deformation via cold weld bond transfer to a flexible substrate as described above.

Figure 23:
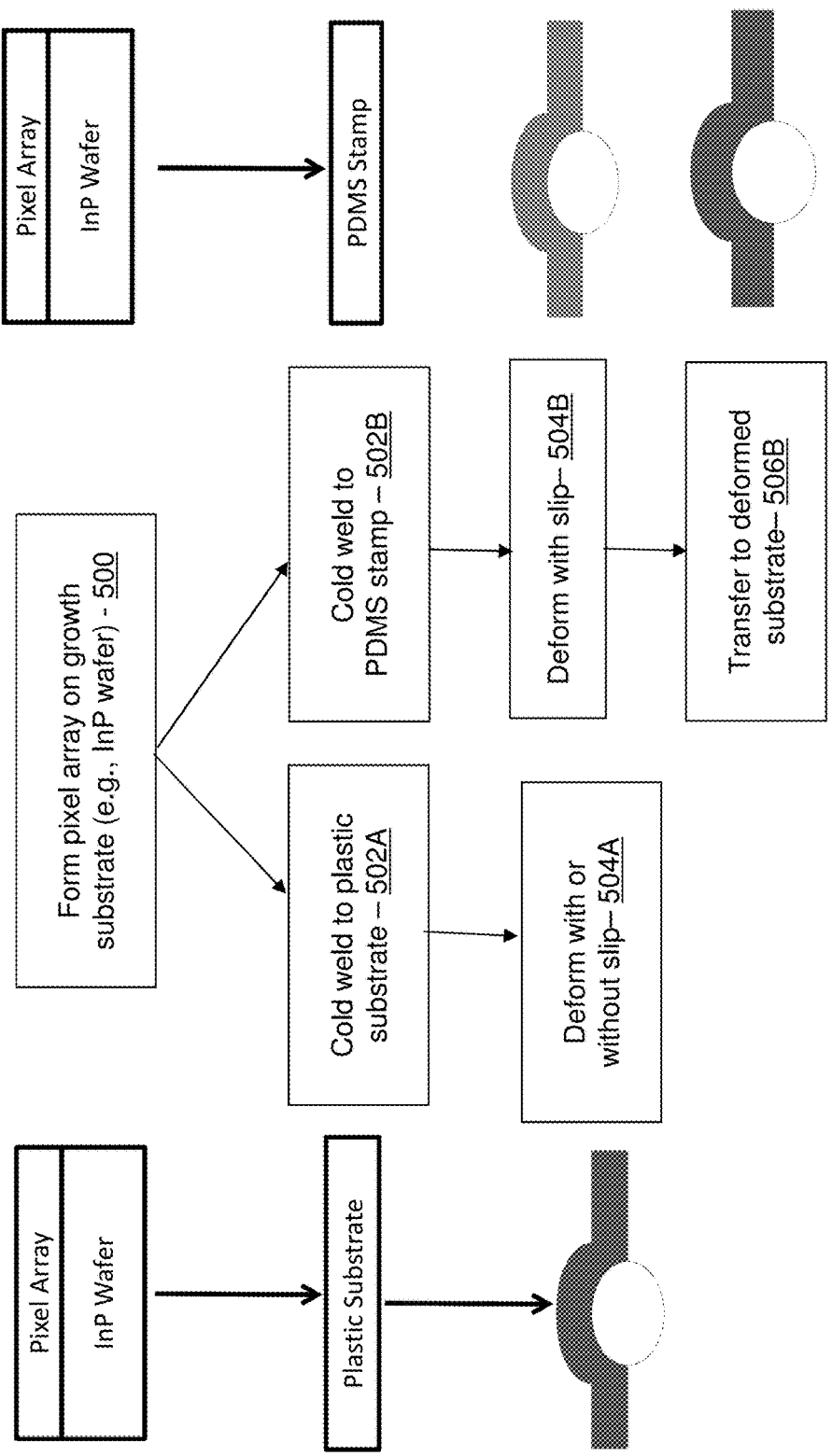
FIG. 23 depicts alternative process flows for transfer of a pixel array to a flexible substrate for deformation of the pixel array into a three-dimensionally contoured shape.

FIG. 23 depicts the steps of two alternative process flows directed to substrate transfer and deformation of the pixel array. Both methods begin as described above in a step 500 in which a pixel array is formed on a growth substrate, such as an InP wafer. In one of the process flows, the method may proceed with a step 502A in which a cold weld bond is established between the pixel array and a plastic substrate, and in which the pixel array is released from the growth wafer. The plastic substrate and the pixel array disposed thereon may then be deformed in a step 504A. In some cases, the photodetector structures are disposed on the inside of the hemispherical (or other) curve. As a result, the photodetector structures may avoid contact with a vacuum mold or chuck or other device relied upon to perform the deformation. During operation, the light travels through the bottom of the photodetector stack in this arrangement. As a result, each pixel is accordingly configured such that the photodetector layers are disposed below the transistor layers to avoid having the transistor layers absorb the incoming light. The deformation may, but need not, rely on relative slip between the device structures and the plastic substrate. The deformation may be implemented with the photodetector structures disposed on either the inside or outside of the hemispherical curve.

The alternative method shown in FIG. 23 involves multiple substrate transfers (e.g., mounts). After the pixel array is formed, a cold weld bond step 502B is performed in which the pixel array is attached to an intermediate stamp assembly having, for instance, a PDMS substrate. After the cold weld bond is formed and the InP wafer is removed, the resulting structure is deformed in a step 504B into a desired contour, which may involve relative slippage between the device structures and the PDMS substrate. The contour of the intermediate structure may be configured to match the contour of a lens or other device on which the device structures are mounted. The lens or other device may provide a more secure or permanent fixture for the array, as well as present a mechanism for encapsulating or otherwise protecting the other side of the array. A transfer step 506B to the lens or other device may, but need not, include the removal of the PDMS substrate. In either case, the mounting (or transfer) reverses or inverts the photodetector structures such that the light now passes through the top of the photodetectors during operation.

The methods and devices disclosed herein generally rely on one or more stamping procedures for transferring devices to a different substrate. In the examples above, for instance, the wafer on which the epitaxial photodetector structures are disposed is eventually pressed against a plastic or other flexible substrate with a metal coating or other layer for transfer thereto. That stamping procedure may not involve the patterning of a metal or other layer. Indeed, in some cases, the disclosed methods do not rely on stamping for patterning or deposition of any of the metal layers.

While the above-described examples rely on InGaAs as the detector material, the disclosed methods and devices are not limited to any particular inorganic semiconductor. As a result of the above-described process flows and device configurations, the brittleness of the detector material does not present a limiting factor in the material selection.

The above-described process flows may be applied to fabricate hemispherical focal plane arrays (FPAs) and other optoelectronic devices using inorganic semiconductors and cold welding for formation on plastic, three-dimensionally deformed or deformable substrates. The process flows are well sited for fabrication of a variety of three-dimensional device shapes.

Figure 24:
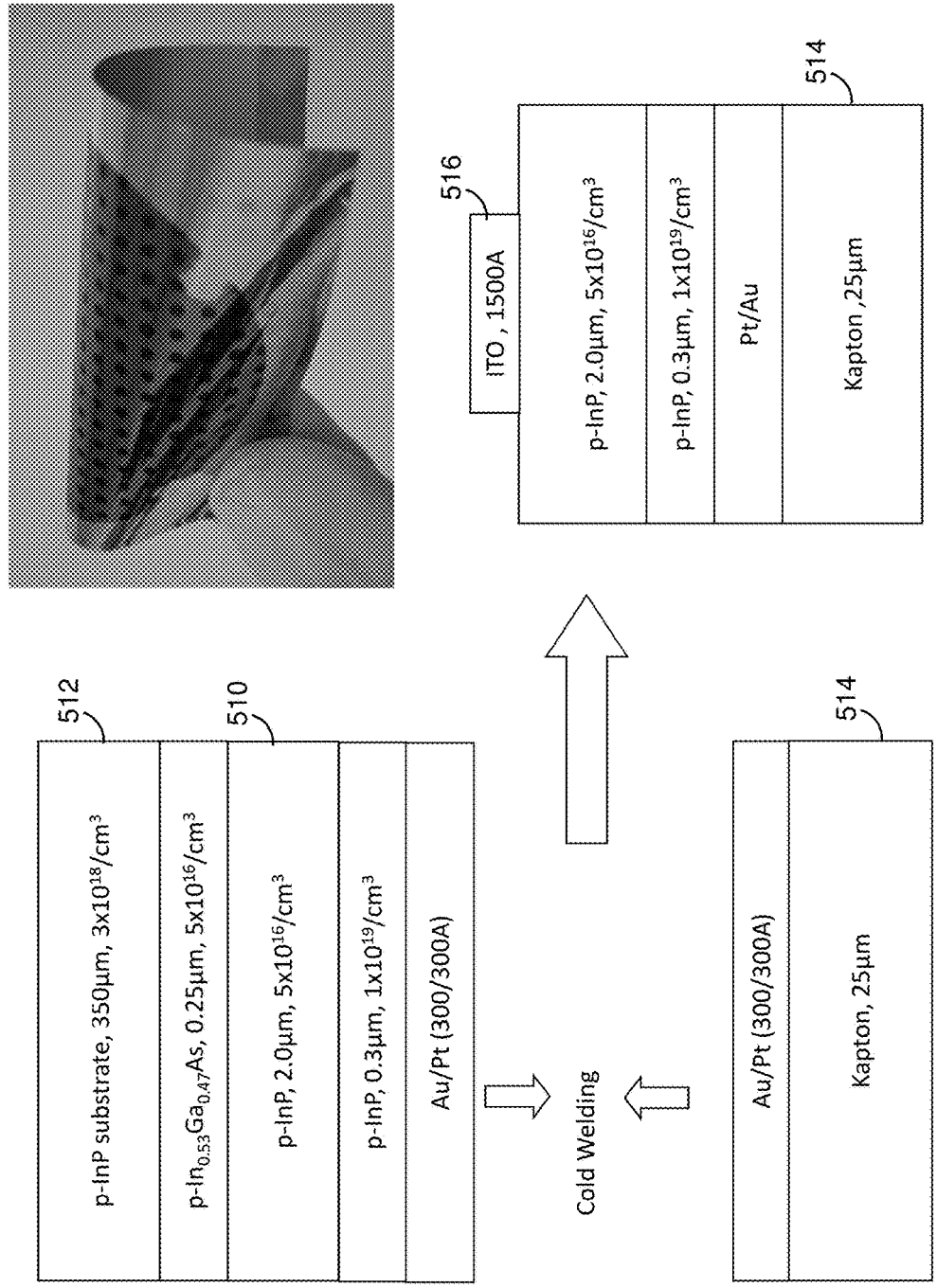
FIG. 24 depicts schematic and photographic representations of an ultrathin-film InP Schottky-type solar cell bonded to a flexible plastic substrate via cold-welding to withstand either compressive or tensile strain by bending over radii of 1.0 cm or greater without degradation.

FIG. 24 depicts an example of an ultrathin film, single-crystal InP Schottky-type solar cell mounted on a flexible plastic substrate and otherwise fabricated in accordance with one or more aspects of the disclosed methods. One or more of the layers of the exemplary solar cell may be configured in a manner similar to the corresponding layers of the above-described devices. A lightly p-doped InP cell 510 is grown epitaxially on an InP substrate 512 via gas source molecular beam epitaxy. The InP substrate 512 is removed via selective chemical wet-etching after the epitaxial layers are cold-welded to a 25 μm thick Kapton® sheet 514, followed by the deposition of an indium tin oxide top contact 516 that forms the Schottky barrier with the InP cell. During testing of the exemplary solar cell, power conversion efficiency under 1 sun of 10.2±1.0%, and specific power of 2.0±0.2 kW/kg are achieved. The exemplary solar cell may tolerate both tensile and compressive stress by bending over a <1 cm radius without damage.

A photograph of the resulting solar cell is also shown in FIG. 24. The photograph provides an example of the flexibility of the solar cell on flexible plastic substrate.

In this example, the epitaxial solar cell structure 510 is grown by gas source molecular beam epitaxy on a p-type, Zn-doped (100) InP substrate 512. The epitaxial structure 510 includes a 0.375 μm thick, p-type ($5 \times 10^{16}$ $cm^{-3}$) InP buffer layer, a 0.25 μm thick, lattice-matched Be-doped ($5 \times 10^{16}$ $cm^{-3}$) p-type $In_{0.53}Ga_{0.47}As$ etch-stop layer, a 2.0 μm thick, lightly p-doped ($5 \times 10^{16}$ $cm^{-3}$) InP absorption layer, and finally, a 0.3 μm thick, lattice-matched Be-doped ($1 \times 10^{19}$ $cm^{-3}$) p-type InP ohmic contact layer.

The fabrication of the solar cells starts with electron beam evaporation of the p-metal contact with thickness of 300 Å Pt followed by 300 Å Au on both the top InP contact layer and the 25 μm thick Kapton sheet. After metal deposition, the wafer is mounted metal-side down on the Kapton sheet, which may be coated with one or more metal layers (e.g., Pt/Au). A bond is formed between the two metal surfaces via cold-welding by applying a pressure of 50 MPa for 60 s using an MTS Alliance RT/100 Testing System.

The InP substrate 512 and the subsequent $In_{0.53}Ga_{0.47}As$ etch-stop layer are then removed using a $H_3PO_4$:HCl=1:3 solution, followed by $H_2SO_4$:$H_2O_2$:$H_2O$=1:1:10. The etch rates for these solutions are 3 μm/min for InP and 0.2 μm/min for $In_{0.53}Ga_{0.47}As$, respectively. Finally, a 150 nm thick indium tin-oxide (ITO) layer is deposited as the Schottky diode contact 516. The contact has an area of 0.785 $mm^2$ defined by a shadow mask. The ITO layer is sputtered at a base pressure of $2 \times 10^{-6}$ torr, RF power of 40 W, and deposition rate of 0.2 Å/sec. The sputtered ITO film typically has a resistivity of ~$1 \times 10^{-2}$ Ωcm and a transmission coefficient of ~80% to wavelengths in the range of 400 nm<λ<900 nm.

FIGS. 25A-25C are directed to comparing the operational performance of the above-described example with a control ITO/InP solar cell. The control device has a structure similar to the thin-film device and is similarly fabricated, but without substrate removal. The current density (J) versus voltage (V) characteristics were measured in the dark and under simulated illumination from an Oriel AM1.5G solar simulator, using HP4155B semiconductor parameter analyzer. The illumination intensity of the solar simulator was calibrated using a National Renewable Energy Laboratory calibrated silicon reference solar cell. The external quantum efficiency (EQE) measurement was conducted by using a monochromator, an SRS830 lock-in amplifier, and a tungsten lamp. The illumination from tungsten lamp is calibrated with a National Institute of Standards and Technology traceable silicon photodetector.

FIGS. 25A-25C show the room temperature J-V characteristics of both the thin-film and control photovoltaic cells under simulated AM1.5G solar spectrum at 1 sun intensity (100 mW/$cm^2$). From the dark J-V characteristics of the thin-film device, the ideality factor and Schottky barrier height of the thin film solar cell are estimated to be n=1.14 and $\varphi_B$=0.93 eV, respectively, by applying the theoretical Richardson constant of p-InP. The specific series resistance and specific shunt resistance of the thin-film device are 5.4 Ω$cm^2$ and $3.8 \times 10^8$ Ω$cm^2$, respectively. The high specific series resistance originates from the nonoptimized ITO contact, and is primarily responsible for the low fill factor of the solar cell. The short circuit photocurrent density (Jsc) for the thin film solar cell is Jsc=30±3 mA/$cm^2$, while for the control, Jsc=24.9±2.5 mA/$cm^2$. Integration of the measured EQE over the AM1.5 solar spectrum gives Jsc=25±3 and 20±2 mA/$cm^2$ for the thin-film and control cells, respectively, consistent with values obtained using simulated solar illumination.

The flexibility of the thin-film solar cells was tested by bending the devices either inward or outward over cylinders of various radii. Inward bending applies compressive strain, while outward bending results in tensile strain to the InP layer (as shown in the legend inset of FIGS. 25A-25C). For each bending radius, the thin film solar cell is stressed for 30 s, released, and then characterized.

FIG. 25C shows Jsc and $\eta_p$, respectively, following the stress test. Here, $\eta_p$ remains unchanged for inward bending radii >0.5 cm (compressive strain ~−0.097%), and for an outward bending radius >1.0 cm (tensile strain ~0.0486%). However, once stressed beyond these values, Jsc shows a decrease, leading to a concomitant reduction in power conversion efficiency. The stress tolerance of an InP thin film solar cell may be improved by using a thinner plastic sheet as the substrate, or placing the thin film at the neutral stress surface located at the center of a sandwich formed by two identically thin sheets of plastic. Also, ITO itself is brittle and subject to cracking during stress. The cracks may initiate in the ITO and propagate into the InP, or vice versa.

Since the Kapton® has a significantly lower density (~1.42 g/$cm^3$) than InP (4.81 g/$cm^3$), the thin-film solar cell is useful for applications where power conversion using lightweight devices is important. Based on the device structure and the measured power efficiency, the specific powers of the thin-film and control ITO/InP solar cells are Psp=2.0±0.2 and 0.041±0.004 kW/kg, respectively, while CIGS or CdTe thin-film solar cells have reported specific powers of 3.3 and 2.0 kW/kg, respectively. By adopting a thinner plastic substrate and using a higher efficiency solar cell architecture, over double the specific power may be achieved.

FIG. 26 depicts an alternative configuration of the above-described flexible or plastic substrates. The alternative configuration does not include the above-described island-shaped strike layers distributed across the flexible substrate for the cold weld bond with the device structures. Instead of having such islands, in this embodiment, a plastic or other flexible substrate 520 has one or more metal layers 522 pre-patterned in an arrangement that matches or otherwise corresponds with a layout 524 of the device structures. An aligned stamp procedure may then be implemented to bond desired metal regions on the device structures to the flexible substrate 520. This configuration may be used as an alternative to island strike layers in each of the embodiments described herein. This configuration may be used to eliminate the chance of shorting pixels, rows, or columns together without an etch for a uniform planar strike layer. In another alternative configuration, the pre-patterned arrangement need not include uniform metal structures, such as the four structures shown in FIG. 26. Instead, the metal layers may include discontinuities within each cold weld bond area. For example, the metal layers may be configured as islands but with a layout that matches or otherwise corresponds with the layout of the device structures.

FIGS. 27 and 28 depict several additional embodiments with contacts on the same side of the substrate or photodetector structure. FIG. 27 shows a top contacted photodetector array 530 and a plastic or other flexible or deformable substrate 532 having contact regions 534, 536 for bonding to, and contacting, the pixels of the array 530. The contact regions 534, 536 are provided for each pixel. The contact regions 534, 536 may be shaped to match or otherwise correspond with the layout of the array 530. The contact regions 534, 536 are patterned on the plastic substrate 532 before the cold weld bond. Interconnects 538 may be patterned on the plastic substrate 532 as well. The interconnects 538 may be isolated from one another via one or more dielectric layers (e.g., $SiN_3$, parylene, $SiO_2$, etc.).

FIG. 28 shows an embodiment in which a target (e.g., flexible) substrate 540 has a number of metal elements 542A, 542B configured to facilitate the cold weld bold with corresponding metal elements 544A, 544B of a photodetector or other device structure 546 on a sacrificial substrate 548. The thicknesses of the metal elements on one or both of the substrates 540, 548 may be configured to present a level, flat, or other complementary interface for the cold weld bonds. For example, the vertical extent of the metal layers on one or both of the substrates 540, 548 may be matched. The thicknesses may be adjusted in other ways to account for the height difference of the device structures 546. For example, the vertical extent need not be such that the top surface of each contact is at the same level as shown. Instead, the contact levels may vary to complement and, thus, accommodate the heights or thicknesses of the contact levels on the other substrate.

An isolation layer 549 may be included to separate the metal elements 542A and 542B from one another. Row and column interconnects of the device structure 546 may thus remain isolated. Notwithstanding the foregoing, the topology of the target substrate 540 need not be adjusted to match the contacts of the device structure 546. The topologies need not exactly match, as the target substrate 540 may deform under pressure to allow for height mismatches between the metal layers.

The bus lines and other interconnects patterned on the flexible or deformable substrate before the transfer of the photodetector or other device structure(s) thereto may vary from the example shown in FIG. 28. The patterning and deposition of such interconnects may include varying levels of height matching and one or more passivation layers to support connections involving multiple transistor or other devices. More complex interconnect schemes for various pixel structure may thus be accommodated.

FIGS. 29A-29C and 30 present alternative methods and designs for managing strain in bus or other interconnect lines connecting the pixels formed via the above-described embodiments. Generally speaking, metal interconnects and bus lines can bend and deform during deformation. However, too much bending and deformation can break the interconnects, the threshold being dependent on, for instance, metal adhesion to surface, thickness of metal lines, deformation conditions, etc. Allowing the interconnects to slip on the surface by having poor adhesion to surface may mitigate breakage.

The alternative methods and designs for mitigating strain shown in FIGS. 29A-29C and 30 introduce a number of strain relief sections in the interconnects. The strain relief sections may be crooked or curved. The curves may be oriented vertically (FIGS. 29A-29C) or laterally (FIG. 30) as shown. In FIG. 29A, a number of structures 560 are deposited on a sacrificial wafer 562 in an area between photodetector or other devices 564. The material(s), shape, and other characteristics of the structures 560 may vary. One or more metal layers 566 may then be deposited over the structures 560, as shown in FIG. 29B. The metal layer 566 may form a row or a column interconnect, for example. The structures 560 may then be removed (via, e.g., an etch procedure) as shown in FIG. 29C, thereby leaving a number of arches 568 in a section of the interconnect. The arches 568 define a vertically crooked path that may provide increased deformation tolerance. In the embodiment of FIG. 30, interconnects include one or more serpentine or other angled sections 570 between devices. Various combinations of these and other vertical and lateral curves may be used.

Described above are devices and methods for making devices having a non-planar inorganic electronic device on a conformal or otherwise flexible substrate in which the device is partially fabricated on a sacrificial wafer and the device is removed from the sacrificial wafer and transferred to the flexible substrate. The non-planar inorganic electronic device may be configured as or include a photodetector device or other optoelectronic device (e.g., an active pixel array or other inorganic electronic device, such as a pressure sensor. The disclosed devices may include a single component or a collection of components, such as a single, a collection, or an array of devices, and/or an integrated circuit with various functionalities. The disclosed devices may be configured as a curved focal plane array for imaging applications. The flexible substrate may include a plastic material, such as Kapton, PET, PETg, or Teflon, or a metal foil. In some cases, the disclosed methods include further processing performed after the transfer to the flexible or conformal substrate, such as various cleaning or debris removal steps, passivation, packaging, and/or patterning and other fabrication of structures disposed on a backside of the device not accessible until after the transfer. In some cases, the devices are transferred to one or more intermediate wafers where further processing may be performed before the transfer to the flexible substrate. The non-planar inorganic electronic device may be fabricated on the sacrificial wafer via a variety of fabrication techniques. The sacrificial wafer may include a rigid substrate. The non-planar inorganic electronic device may be parted or otherwise released from the sacrificial wafer using epitaxial lift-off. A lift-off release layer, such as AlAs or $SiO_2$ may be used. Alternatively or additionally, non-planar inorganic electronic device may be parted or otherwise released the sacrificial wafer using a strain/shear layer. Alternatively, the sacrificial wafer is removed by polishing and wet etching from the back of the wafer. The sacrificial wafer may include a semiconductor material, such as Si, GaAs, or InP, or sapphire or a glass. The transfer may be implemented by using different bond strengths to select the interface that is parted.

The transfer may be implemented via metal-metal cold-weld bonding. The cold-weld bond may be formed at an elevated pressure (e.g., above atmospheric pressure) and a low temperature (e.g., below the softening point of the flexible substrate).

The metal layer deposited on the flexible or conformal substrate may be unpatterned or patterned, such as patterned into stripes or patterned into islands. In patterned embodiments, the patterned layer may provide connections between various points of the device or circuit. Alternatively or additionally, the patterning physically bonds the device to the flexible substrate, while maintaining electrical isolation between various parts of the circuit.

In some embodiments, fabrication of the interconnects and other aspects of the electronic device is completed before the transfer to the flexible substrate. Other aspects of the fabrication of the electronic device may also be completed before the transfer. In some cases, fabrication of the electronic device is complete before the transfer.

The device may be passivated with one or more insulating layers, and then coated with an additional metal layer for bonding. The bonding may then involve attachment to an unpatterned, coated flexible substrate.

In some cases, additional fabrication processing is implemented after transfer to the flexible or conformal substrate. For example, the additional processing may include etching, patterning, deposition of insulators, deposition of interconnects, passivation, packaging, and/or depositing non-traditional layers (e.g., organic semiconductors).

The flexible substrate may be deformed into a desired shape mechanically, thermally, or via other techniques. The deformation may involve a mechanical mold, heat treatment, vacuum suction, and/or strain relaxation before transfer of the devices to the flexible substrate. Alternatively, the flexible substrate is deformed into the desired shape involving such techniques or equipment after transfer of the devices to the flexible substrate.

Devices, structures, or material from multiple sacrificial wafers may be transferred to the flexible substrate. The multiple sacrificial wafers may include different materials and provide different functionality, such as detectors, transistors, and/or read-out electronics. The disclosed devices may thus include structures or devices fabricated via different material systems, including, for example, incompatible material systems.

In some embodiments, the disclosed methods include creating a photodetector structure on a first substrate, in which the photodetector structure includes a release layer and a plurality of inorganic semiconductor layers supported by the release layer, the plurality of inorganic semiconductor layers being active in operation of the optoelectronic device. The methods further include depositing a first metal contact on the photodetector structure, depositing a second metal contact on a second substrate, the second substrate being flexible, attaching the first and second substrates via a cold weld bond between the first and second metal contacts, lifting off or otherwise releasing the first substrate, and deforming the second substrate to a non-planar configuration.

In some embodiments, the disclosed devices include a three-dimensionally curved substrate, a patterned metal layer disposed on the curved substrate and an array of photodetectors, each photodetector including a photodetector structure supported by the curved substrate. Each photodetector structure includes an inorganic semiconductor stack. The disclosed devices further include first and second sets of contact stripes extending across the curved substrate, each photodetector structure being coupled to a respective contact stripe of the first set of contact stripes and a respective contact stripe of the second set of contact stripes. The array of photodetectors is secured to the curved substrate via a bond between the patterned metal layer and one or both of the first and second sets of contact stripes.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A device comprising:
   a three-dimensionally curved substrate;
   a patterned metal layer disposed on the curved substrate;
   an array of optoelectronic devices, each optoelectronic device comprising an optoelectronic structure supported by the curved substrate, wherein each optoelectronic structure comprises an inorganic semiconductor stack; and
   a set of contact stripes extending across the curved substrate, each optoelectronic structure being coupled to a respective contact stripe of the set of contact stripes;
   wherein the patterned metal layer is in direct, physical contact with, and configured for adhesion to, the curved substrate;
   wherein the patterned metal layer is a strike layer of a bond between the patterned metal layer and the set of contact stripes;
   wherein the array of optoelectronic devices is secured to the curved substrate via the bond between the patterned metal layer and the set of contact stripes; and
   wherein the patterned metal layer and the set of contact stripes have different patterning.

2. The device of claim 1, wherein the inorganic semiconductor stack comprises a Group III-V semiconductor layer.

3. The device of claim 1, wherein the patterned metal layer comprises a plurality of islands, each island having a lateral area smaller than a lateral area of each optoelectronic structure such that adjacent contact stripes are not shorted to one another.

4. The device of claim 1, wherein each contact stripe comprises a strain relief section.

5. The device of claim 1, further comprising a plurality of electronic devices supported by the curved substrate, wherein:
   each optoelectronic device comprises a respective photodetector device, and
   a respective one or more of the plurality of electronic devices is configured with a respective one of the photodetector devices as an active pixel of a curved focal plane array.

6. The device of claim 5, wherein the patterned metal layer is configured to provide a connection between the one or more electronic devices and the photodetector in each active pixel.

7. The device of claim 1, wherein the patterned metal layer has a pattern that matches a layout of the optoelectronic structures of the array of optoelectronic devices.

8. The device of claim 1, wherein each optoelectronic structure is disposed on a respective contact stripe of the set of contact stripes.

9. The device of claim 1, further comprising a further set of further contact stripes running as interconnects between adjacent optoelectronic devices in the array, wherein:
the further set of further contact stripes are oriented perpendicularly to the set of contact stripes; and
each further contact stripe of the further set of contact stripes is disposed on respective optoelectronic structures of the array of optoelectronic devices.

10. The device of claim 9, wherein each further contact stripes of the further set of further contact stripes follows a contour of the inorganic semiconductor stacks of respective optoelectronic structures of the array of optoelectronic devices.

11. The device of claim 9, wherein a profile of each further contact stripe of the further set of further contact stripes has rounded corners as the further contact stripe follows the contour of the inorganic semiconductor stacks, the rounded corners acting as stress-absorbing springs.

12. The device of claim 9, wherein each further contact stripe of the further set of further contact stripes is a flat, strip-shaped layer.

13. The device of claim 1, further comprising a further set of further contact stripes running as interconnects between adjacent optoelectronic devices in the array, wherein:
the further set of further contact stripes are oriented perpendicularly to the set of contact stripes; and
each optoelectronic structure has a layout such that a respective further contact stripe of the further set of further contact stripes is disposed along a lateral side of the inorganic semiconductor stack.

14. The device of claim 1, wherein the patterned metal layer comprises a plurality of metal structures of varying thicknesses.

15. The device of claim 1, wherein a respective contact stripe of the set of contact stripes comprises a curved strain relief section between adjacent optoelectronic devices of the array of optoelectronic devices.

16. The device of claim 15, wherein the curved strain relief section comprises an arch.

17. A device comprising:
a three-dimensionally curved substrate;
a patterned metal layer disposed on the curved substrate;
an array of optoelectronic devices, each optoelectronic device comprising an optoelectronic structure supported by the curved substrate, wherein each optoelectronic structure comprises an inorganic semiconductor stack; and
a set of contact stripes extending across the curved substrate, each optoelectronic structure being coupled to a respective contact stripe of the set of contact stripes;
wherein the patterned metal layer is in direct, physical contact with, and configured for adhesion to, the curved substrate;
wherein the patterned metal layer is a strike layer of a bond between the patterned metal layer and the set of contact stripes;
wherein the array of optoelectronic devices is secured to the curved substrate via the bond between the patterned metal layer and the set of contact stripes;
wherein:
the patterned metal layer comprises a plurality of islands; and
each contact stripe of the set of contact stripes extends across, and is contact with, multiple islands of the plurality of islands.

18. A device comprising:
a three-dimensionally curved substrate;
a patterned metal layer disposed on the curved substrate;
an array of optoelectronic devices, each optoelectronic device comprising an optoelectronic structure supported by the curved substrate, wherein each optoelectronic structure comprises an inorganic semiconductor stack; and
a set of contact stripes extending across the curved substrate, each optoelectronic structure being coupled to a respective contact stripe of the set of contact stripes;
an adhesion reduction layer disposed between the three-dimensionally curved substrate and the patterned metal layer to allow greater shear slip;
wherein the array of optoelectronic devices is secured to the curved substrate via a bond between the patterned metal layer and the set of contact stripes; and
wherein the patterned metal layer and the set of contact stripes have different patterning.

19. The device of claim 18, wherein the adhesion reduction layer comprises a fluorocarbon material.

* * * * *